(12) United States Patent
Bamesberger et al.

(10) Patent No.: US 12,165,903 B2
(45) Date of Patent: *Dec. 10, 2024

(54) CHUCK ASSEMBLY, PLANARIZATION PROCESS, APPARATUS AND METHOD OF MANUFACTURING AN ARTICLE

(71) Applicant: CANON KABUSHIKI KAISHA, Tokyo (JP)

(72) Inventors: Seth J. Bamesberger, Austin, TX (US); Se-Hyuk Im, Austin, TX (US); Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/338,800

(22) Filed: Jun. 21, 2023

(65) Prior Publication Data

US 2023/0335428 A1 Oct. 19, 2023

Related U.S. Application Data

(63) Continuation of application No. 17/069,614, filed on Oct. 13, 2020, now Pat. No. 11,728,203.

(51) Int. Cl.

| H01L 21/683 | (2006.01) |
| B29C 43/18 | (2006.01) |
| B29L 31/34 | (2006.01) |
| H01L 21/02 | (2006.01) |
| H01L 21/3105 | (2006.01) |

(52) U.S. Cl.
CPC .... *H01L 21/6838* (2013.01); *H01L 21/02118* (2013.01); *H01L 21/02282* (2013.01); *H01L 21/02348* (2013.01); *H01L 21/31058* (2013.01); *B29C 43/18* (2013.01); *B29L 2031/3406* (2013.01)

(58) Field of Classification Search
None
See application file for complete search history.

(56) References Cited

U.S. PATENT DOCUMENTS

| 6,159,079 A | * | 12/2000 | Zuniga | B24B 37/30 |
| | | | | 451/286 |
| 6,210,255 B1 | * | 4/2001 | Zuniga | B24B 37/30 |
| | | | | 451/41 |
| 11,728,203 B2 | * | 8/2023 | Bamesberger | H01L 21/67115 |
| | | | | 438/760 |

FOREIGN PATENT DOCUMENTS

JP 2017112230 A * 6/2017

OTHER PUBLICATIONS

Machine language translation of JP 2017-112230 A (Year: 2017).*

* cited by examiner

*Primary Examiner* — Erik Kielin
(74) *Attorney, Agent, or Firm* — Canon U.S.A., Inc. I.P. Division

(57) ABSTRACT

A chuck assembly for holding a plate comprises a member configured to hold the plate, the member including a flexible portion configured to have a central opening, and a first cavity formed by the flexible portion, wherein the plate is held by the flexible portion by reducing pressure in the first cavity, a light-transmitting member covering the central opening of the member, and a fluid path in communication with a second cavity defined by the member, the plate held by the member and the light-transmitting member for pressurizing the second cavity.

20 Claims, 19 Drawing Sheets

CHUCK ASSEMBLY, PLANARIZATION PROCESS, APPARATUS AND METHOD OF MANUFACTURING AN ARTICLE

CROSS-REFERENCE TO RELATED APPLICATIONS

This application is a continuation of U.S. application Ser. No. 17/069,614, filed Oct. 13, 2020, which is hereby incorporated by reference in its entirety.

BACKGROUND

Field of Art

The present disclosure relates to substrate processing, and more particularly, to a chuck assembly used in the planarization of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization reduces the impact of depth of focus (DOF) limitations, and improves critical dimension (CD), and critical dimension uniformity. In extreme ultraviolet lithography (EUV), planarization improves feature placement and reduces the impact of DOF limitations. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

In current planarization methods, there may be difficulty in controlling the superstrate curvature and spread of polymerizable material near the edge of the superstrate. Furthermore, there may be difficulty in separating the superstrate from a cured film, in particular when the superstrate has a similar size to the substrate. There is a need in the art for a chuck assembly and planarization method with improved control of the superstrate curvature and improved separation from the cured film.

SUMMARY

A chuck assembly for holding a plate comprises a member configured to hold the plate, the member including a flexible portion configured to have a central opening, and a first cavity formed by the flexible portion, wherein the plate is held by the flexible portion by reducing pressure in the first cavity, a light-transmitting member covering the central opening of the member, and a fluid path in communication with a second cavity defined by the member, the plate held by the member and the light-transmitting member for pressurizing the second cavity.

A planarization system comprises a chuck assembly configured to hold a plate, the chuck assembly comprising a member configured to hold the plate, the member including a flexible portion configured to have a central opening, and a first cavity formed by the flexible portion, wherein the plate is held by the flexible portion by reducing pressure in the first cavity, a light-transmitting member covering the central opening of the member, and a fluid path in communication with a second cavity defined by the member, the plate held by the member and the light-transmitting member for pressurizing the second cavity, a substrate chuck configured to hold a substrate, a fluid dispenser configured to dispense formable material on the substrate, a positioning system configured to contact the formable material with the plate, and a curing system configured to cure the formable material under the plate so as to form cured formable material on the substrate.

A method of manufacturing an article comprises dispensing a formable material on a substrate, retaining a plate with a plate chuck assembly, the plate chuck assembly comprising a member configured to hold the plate, the member including a flexible portion configured to have a central opening, and a first cavity formed by the flexible portion, wherein the plate is held by the flexible portion by reducing pressure in the first cavity, a light-transmitting member covering the central opening of the member, and a fluid path in communication with a second cavity defined by the member, the plate held by the member and the light-transmitting member for pressurizing the second cavity, contacting the plate with the formable material dispensed on the substrate, curing the formable material with a curing source, separating the plate from the cured formable material, and processing the cured formable material to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
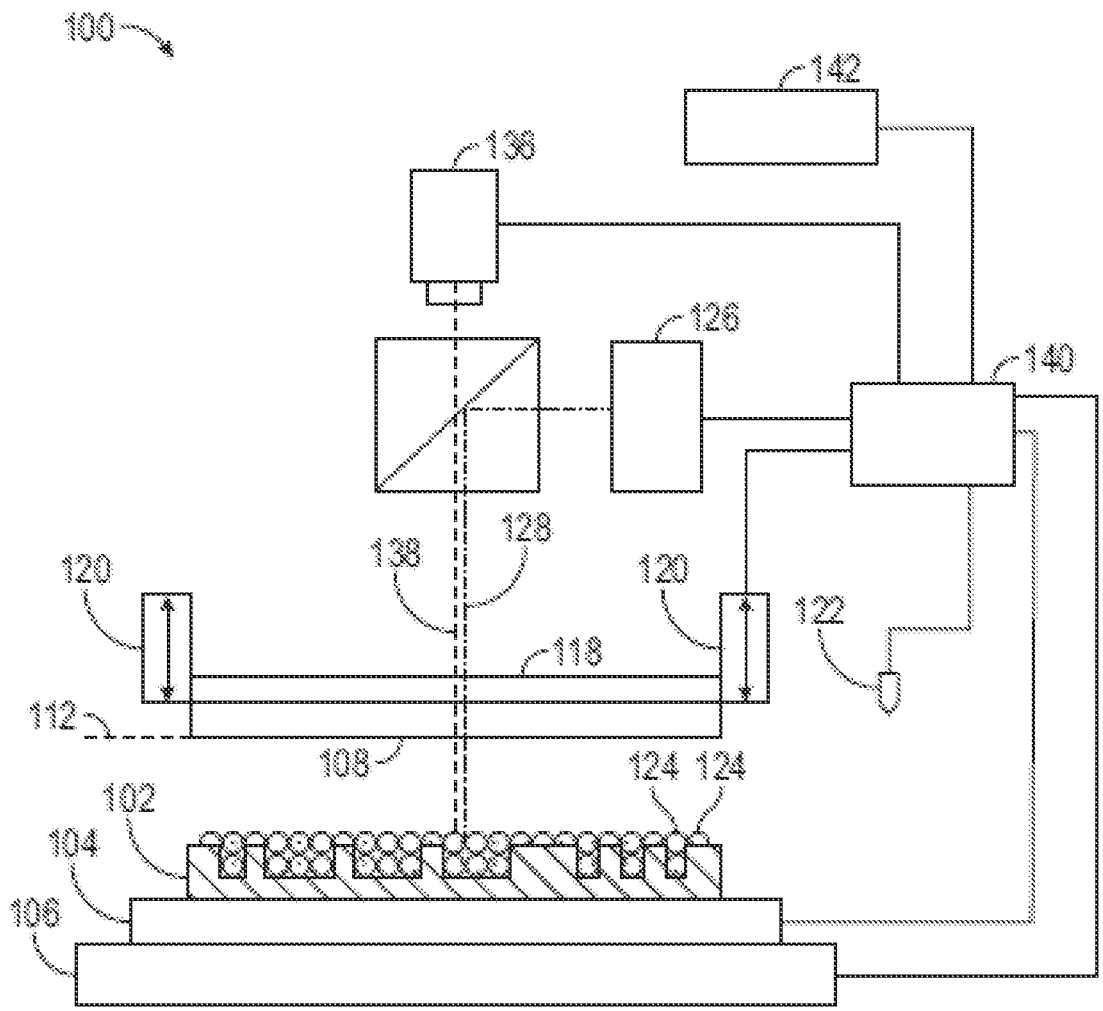
FIG. 1 is a schematic diagram illustrating an example planarization system in accordance with an aspect of the present disclosure.

FIG. 1 illustrates an example system for planarization in accordance with an aspect of the present disclosure. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 (also referred herein as a plate) having a working surface 112 facing substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. The working surface 112 is generally of the same areal size or slightly smaller as the surface of the substrate 108.

The superstrate 108 may be coupled to or retained by a superstrate chuck assembly 118, which is discussed in more detail below. The superstrate chuck assembly 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The planarization system 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The planarization system 100 may further comprise a curing system that includes a radiation source 126 that directs actinic energy, for example, UV radiation, along an exposure path 128. The planarization head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 124. FIG. 1 shows the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The planarization system 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the planarization system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the working surface 112 and the substrate surface.

The planarization system 100 may be regulated, controlled, and/or directed by one or more processors 140 (controller) in communication with one or more components and/or subsystems such as the substrate chuck 104, the substrate positioning stage 106, the superstrate chuck assembly 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140.

In operation, either the planarization head 120, the substrate position stage 106, or both vary a distance between the superstrate 108 and the substrate 102 to define a desired space (a bounded physical extent in three dimensions) that is filled with the formable material 124. For example, the planarization head 120 may be moved toward the substrate and apply a force to the superstrate 108 such that the superstrate contacts and spreads droplets of the formable material 124 as further detailed herein.

Planarization Process

Figure 2A:
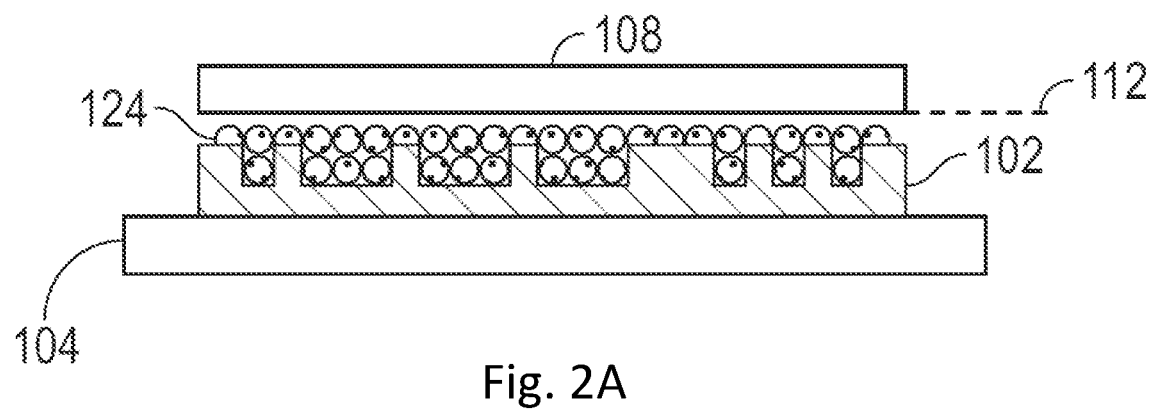
FIGS. 2A to 2C illustrate a schematic cross section of an example planarization process in accordance aspect of the present disclosure.
Figure 2B:
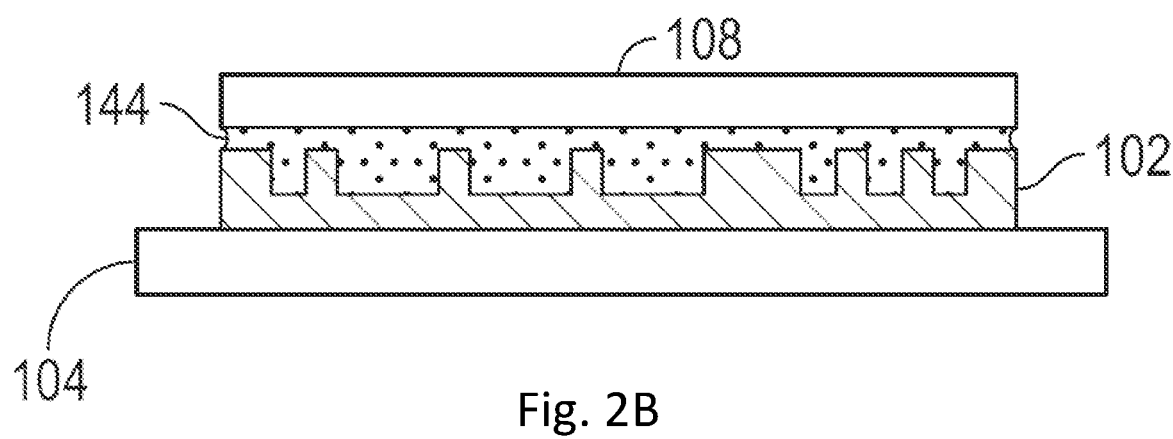
Figure 2C:
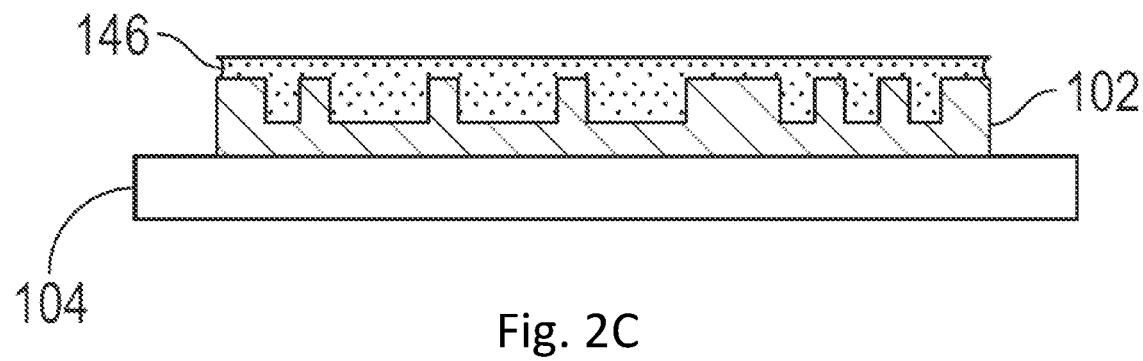

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2c illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Spreading, Filling, and Curing Planarization Material Between Superstrate and Substrate One scheme for minimizing entrapment of air or gas bubbles between the superstrate 108 and the substrate 102 as the formable material 124 droplets spread, merge and fill the gap between the superstrate 108 and the substrate 102 is to position the superstrate 108 such that it makes initial contact with the formable material 124 in the center of the substrate 102 with further contact then proceeding radially in a center to perimeter fashion. This requires a deflection or bowing of the superstrate 108 or substrate 102 or both to create a curvature in the superstrate 108 relative to the substrate 102. The curvature of the superstrate 108 facilitates the expulsion of the air or gas bubbles as the formable material 124 spreads. Such a superstrate 108 profile can be obtained by, for example, applying a back pressure to the interior region of the superstrate. However, in doing so, a perimeter holding region is still required to keep the superstrate 108 retained on the superstrate chuck 118. Given that the superstrate 108 is typically of the same or similar areal dimension as the substrate 102, if both the perimeter edges of the superstrate 108 and the substrate are 102 chucked flat during formable material 124 droplet spreading and merging, there will be no available superstrate curvature profile in this flat chucked area. This may compromise the droplet spreading and merging, which may also lead to non-fill defects in the region. To minimize non-fill defects, the superstrate curvature needs to be controlled over the full superstrate diameter during the fluid spreading process. In addition, once spreading and filling of the formable material is complete, the resultant stack of a superstrate chuck, a chucked superstrate, the formable material, substrate, and a substrate chuck can be an over-constrained system. This may cause a non-uniform planarization profile of the resultant planarized film layer. That is, in such an over-constrained system, all flatness errors or variations from the superstrate chuck, including front-back surface flatness, can be transmitted to the superstrate and impact the uniformity of the planarized film layer.

Figure 8:
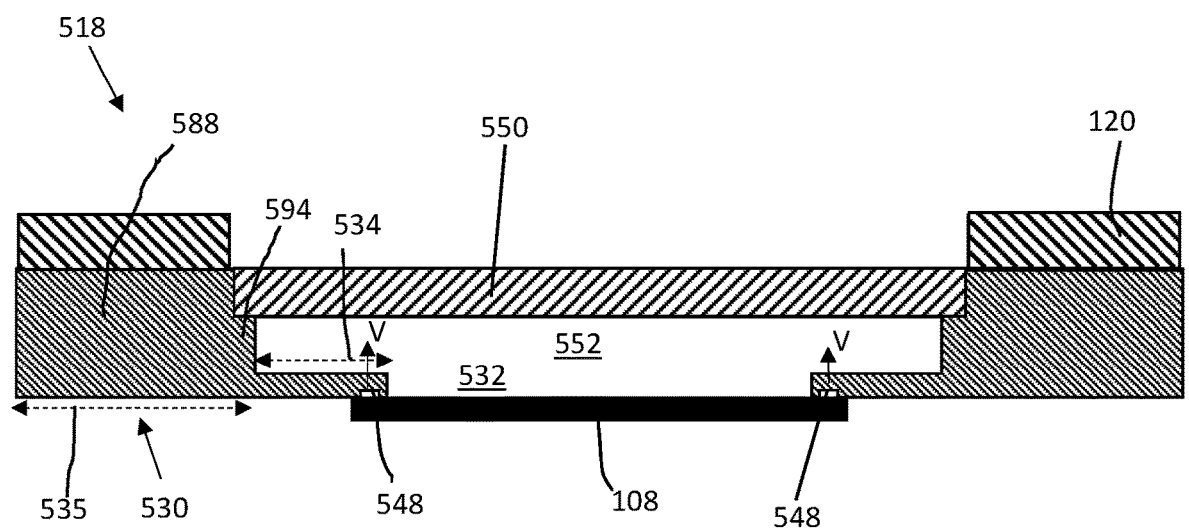
FIG. 8 shows a schematic representation of an example chuck assembly is accordance with a second embodiment of the present disclosure.

To resolve the above issues a chuck assembly 118 is provided as shown in FIGS. 3A to 5F in accordance with a first example embodiment and a chuck assembly 518 is provided as shown in FIG. 8 in accordance with a second example embodiment.

Figure 3A:
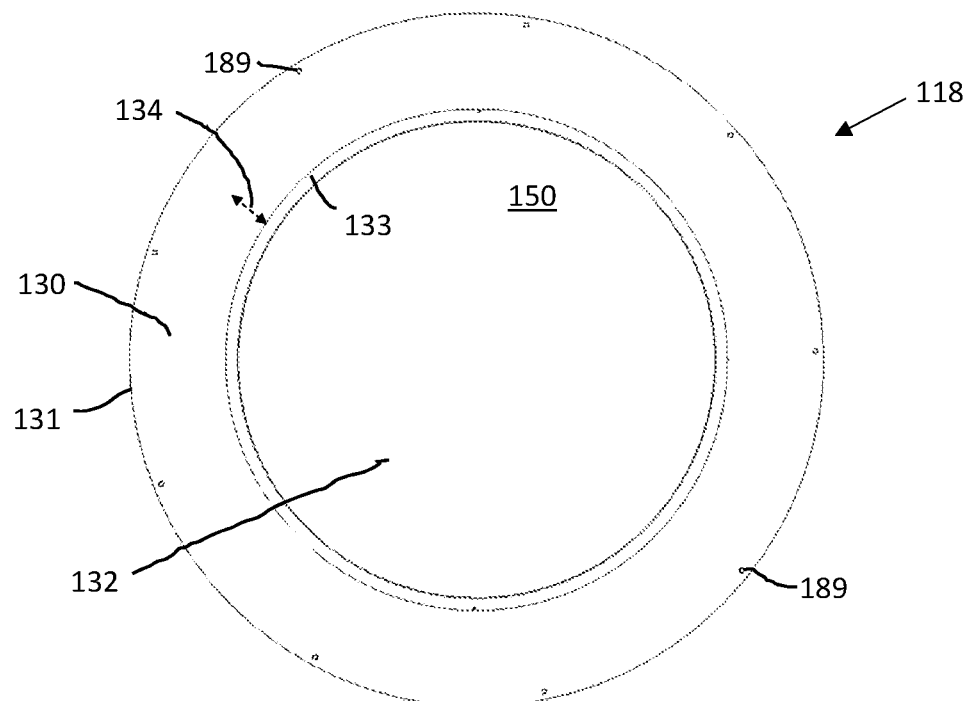
FIG. 3A shows a bottom view of an example chuck assembly is accordance with a first embodiment of the present disclosure.
Figure 3B:
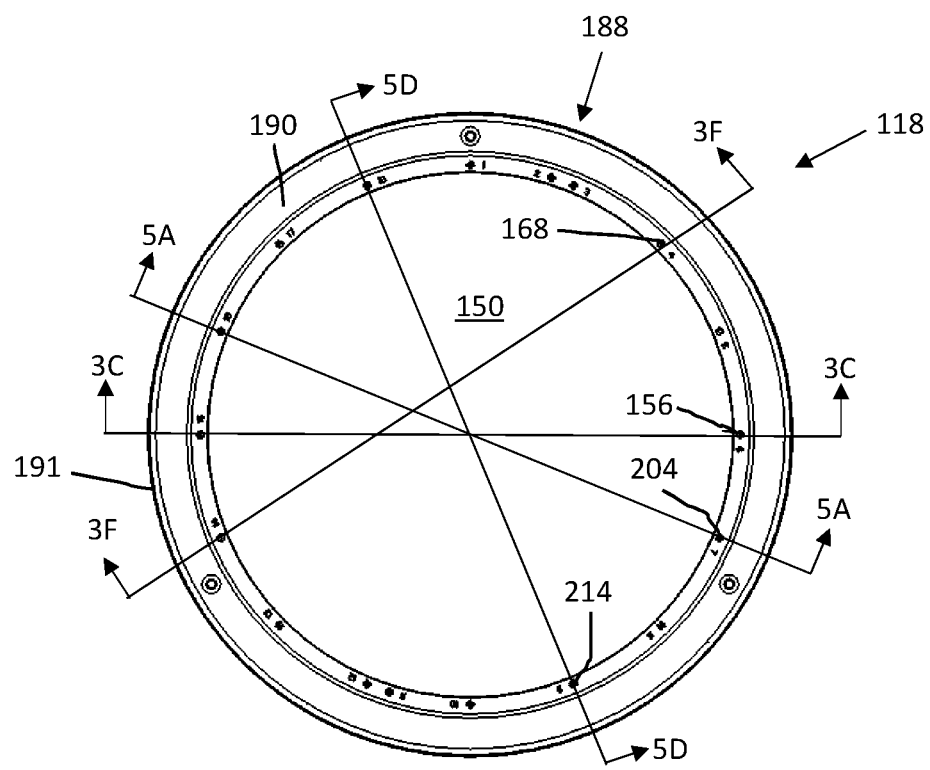
FIG. 3B shows a top view of the chuck assembly of FIG. 3A.
Figure 3C:
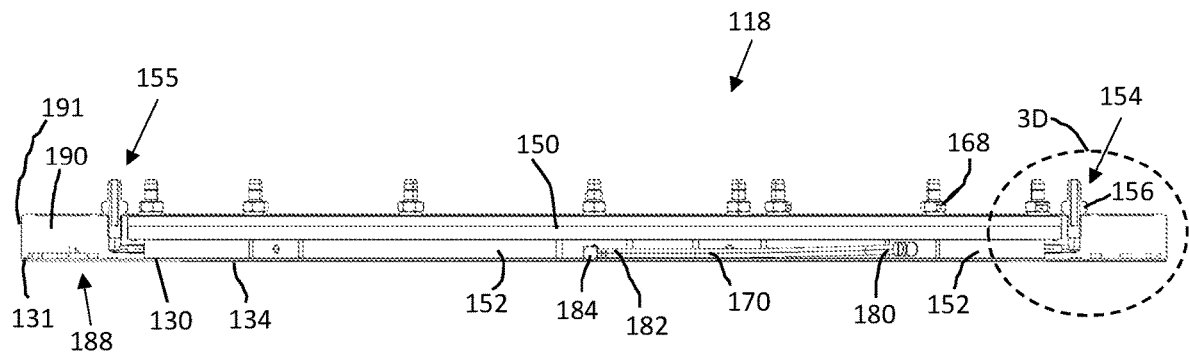
FIG. 3C shows a cross section taken along line 3C-3C of FIG. 3B.
Figure 3D:
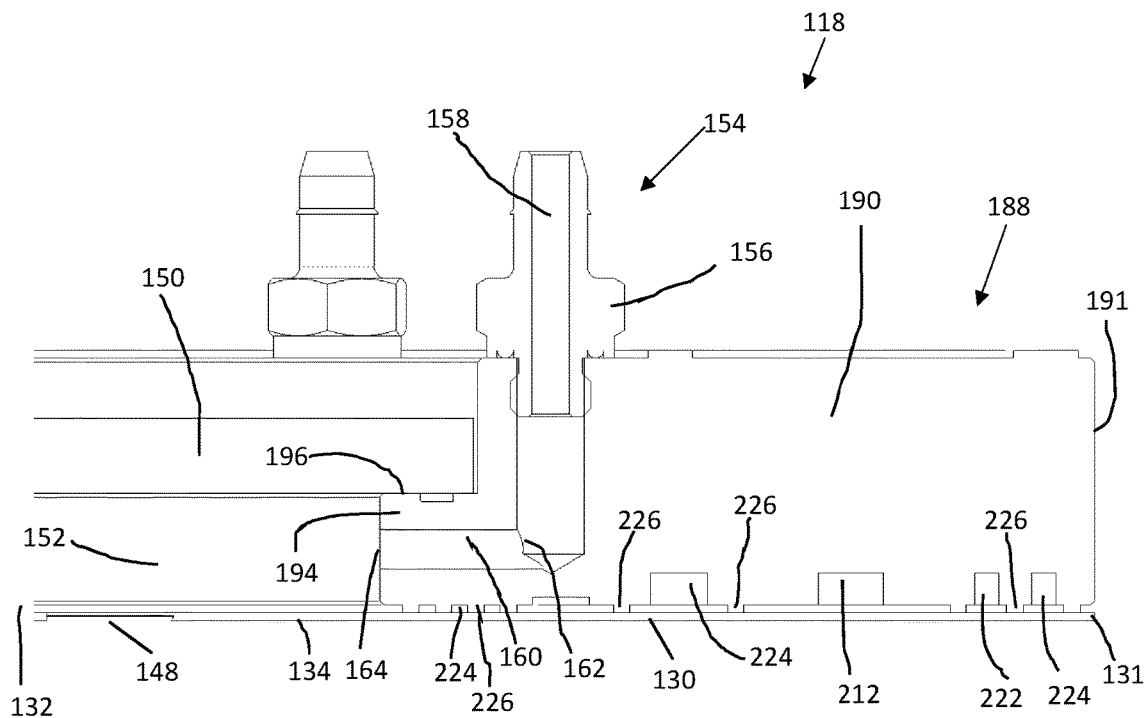
FIG. 3D shows an enlarged portion 3D of FIG. 3C.
Figure 3E:
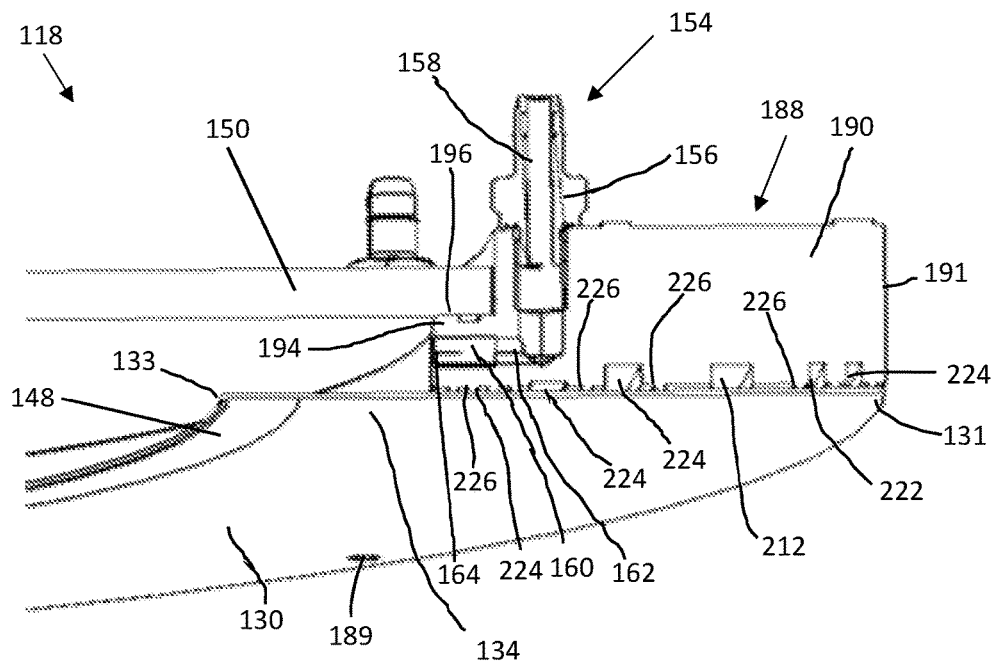
FIG. 3E shows a perspective view of the enlarged portion 3D of the FIG. 3C.

FIG. 3A shows a bottom view of the chuck assembly 118. FIG. 3B shows a top view of the chuck assembly 118. FIG. 3C shows a cross section taken along line 3C-3C of FIG. 3B. FIG. 3D shows an enlarged portion 3D of FIG. 3C. FIG. 3E shows a perspective view of the enlarged portion 3D of the FIG. 3C.

As shown in FIGS. 3A to 3E, the chuck assembly 118 may include a member 130 preferably having a ring shape. The member 130 may include a flexible portion 134. The size of the flexible portion 134 of the member 130 may be varied while performing the planarization process, as discussed below in more detail. The thickness of the member 130, including the flexible portion 134, may be from 0.2 to 5 mm or 0.3 to 2 mm in an example embodiment. The length of the flexible portion 134 at a point in the process when the flexible portion 134 is shortest (i.e., the state shown in FIGS. 7A to 7F discussed below) may be 10 mm to 200 mm or 20 to 75 mm in an example embodiment. The ratio of the length of the flexible portion to the thickness of the flexible portion may be 1000:1 to 2:1. In an embodiment, the ratio of the length of the flexible portion to the thickness of the flexible portion may be 5:1 to 200:1. A thicker material with a low elastic modulus will be similarly flexible as a thin material with high elastic modulus. The member 130 may be composed of a material having modulus of elasticity (Young's modulus) of 1 to 210 GPa, 50 to 150 GPa, or 60 to 100 GPa. In one example embodiment, the modulus of elasticity may be 70 GPa. The member 130 may be made of a transparent material that allows UV light to pass through or may not be made of a transparent material that allows for UV light to pass through. That is the member 130 may or may not be composed of an opaque material with respect to UV light. The member 130 may be composed of a plastic (e.g., acrylic), a glass (e.g. fused silica, borosilicate), metal (e.g. aluminum, stainless steel), or a ceramic (e.g. zirconia, sapphire, alumina). The member 130 may further have a flexural rigidity of 0.01 to 5 Pa·m$^3$, 0.1 to 4 Pa·m$^3$, 0.5 to 3 Pa·m$^3$, 1.0 to 2 Pa·m$^3$. Additionally, a ratio of the flexural rigidity of the member to the flexural rigidity of the superstrate may be 0.01:1 to 5:1, 0.05:1 to 4:1, 0.1:1 to 3:1, or 0.5:1 to 1:1, preferably less than 1:1. Equation (1) below defines the flexural rigidity D in which: H is the thickness of the superstrate 108 or the flexible portion 134 of the member 130; v is Poisson's ratio of the material of the superstrate 108 or the flexible portion 134 of the member 130; and E is Young's modulus of the material of the superstrate 108 or the flexible portion 134 of the member 130. For example, the flexural rigidity for the superstrate may be 2.12 while the flexural rigidity of the flexible portion 134 of the member 130 may be 0.29, 0.68, 0.82, or 2.30 Pa·m$^3$. And the ratio of the flexural rigidity of the flexible portion 134 of the member 130 to the flexural rigidity of the superstrate 108 may be: 0.14:1; 0.32:1; 0.39:1; or 1.09:1.

$$D = \frac{EH^3}{12(1 - v^2)} \quad (1)$$

The member 130 may further include a first cavity 148 (FIGS. 3D, 3E, 3I, 5C, 5F, 7A-73) configured to hold a portion of the superstrate 108 to the flexible portion 134 of the member 130. The first cavity 148 may be an annular cavity concentrically surrounding the central opening 132. The first cavity 148 may be located adjacent the inner edge 133 of the member. The first cavity 148 may be formed as a recessed portion in the flexible portion 134.

The chuck assembly 118 may further include a light-transmitting member 150 that covers the central opening 132 of the member 130. In one example embodiment, the light-transmitting member 150 is preferably transparent to UV light with high UV light transmissivity. That is, the material composition of the light-transmitting 150 member may be selected such that UV light used to cure the formable material passes through the light-transmitting member 150. In one example embodiment when the light-transmitting member 150 transmits UV light, the light-transmitting member may be composed of a material that transmits greater than 80% of light having a wavelength of 310-700 nm (i.e., UV light and visible light), e.g., sapphire, fused silica). In another example embodiment, the light-transmitting member need not be transparent with respect to UV light. When the light-transmitting member need not be transparent with respect to UV light, the light-transmitting member may be composed of a material that transmits greater than 80% of light having a wavelength of 400-700 nm (i.e., visible light), e.g., glass, borosilicate. That is, in the case when it is not necessary to transmit UV light, the light-transmitting member 150 should still transmit visible light.

As best seen in FIGS. 3C, 3D, and 3E the chuck assembly 118 may include a second cavity 152 defined by the member 130 and the light-transmitting member 150. More particularly, an underside surface of the light-transmitting member 150 and an upper surface of the member 130, being spaced apart, together define the second cavity 152. The second cavity 152 may be further defined by the inner side wall of the support ring 188. As also best seen in FIGS. 3C, 3D, 3E, the chuck assembly 118 may further include a fluid path 154 in communication with the second cavity 152 for pressurizing the second cavity 152. As used herein, pressurizing includes both positive pressure and negative pressure. The fluid path 154 can also be used to open the second cavity 152 to atmosphere. The fluid path 154 may include components that together allow the second cavity 152 to be selectively positively or negatively pressurized. In the illustrated example, the fluid path 154 includes a first port 156 connectable with a pressurizing source (not shown). The first port 156 may be connected to the pressurizing source via a tube (not shown), for example. The first port 156 includes a first passage 158 in communication with a second passage 160, where a first end 162 of the second passage 160 connects with the first passage 158 and a second end 164 of the second passage 160 connects to the second cavity 152. Thus, when the first port 156 is connected to the pressurizing source, positive pressure can be applied to pressurize the second cavity 152 via the first fluid path 154. One or more additional fluid paths may be implemented that have the same structure as the above-discussed fluid path 154. For example, as best seen in FIG. 3C, an additional fluid path 155 having the same structure as the fluid path 154 may be located at a position diametrically opposing the fluid path 154.

Figure 3F:
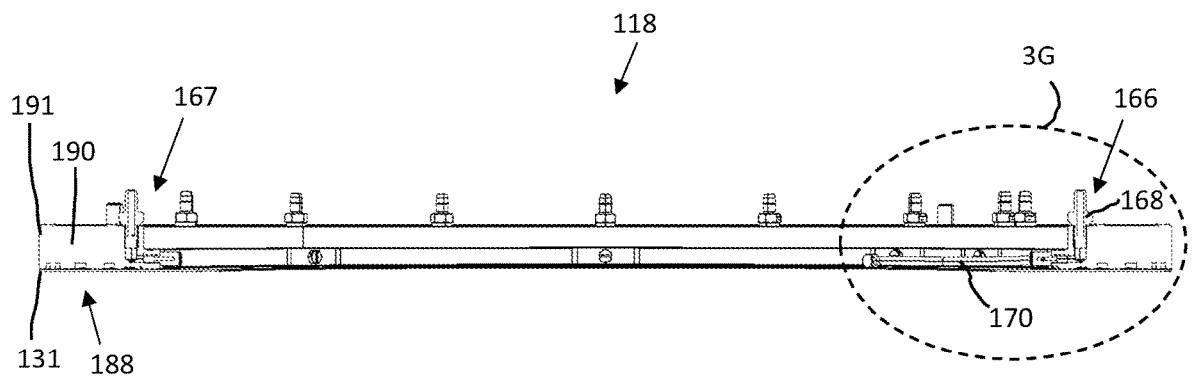
FIG. 3F shows a cross section taken along line 3F-3F of FIG. 3B.
Figure 3G:
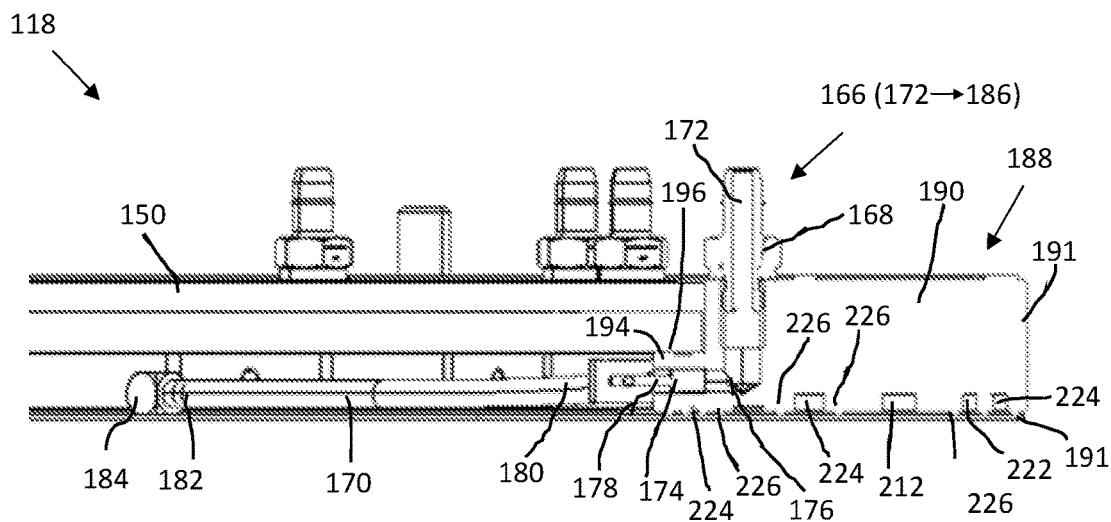
FIG. 3G shows an enlarged portion 3G of FIG. 3F.
Figure 3H:
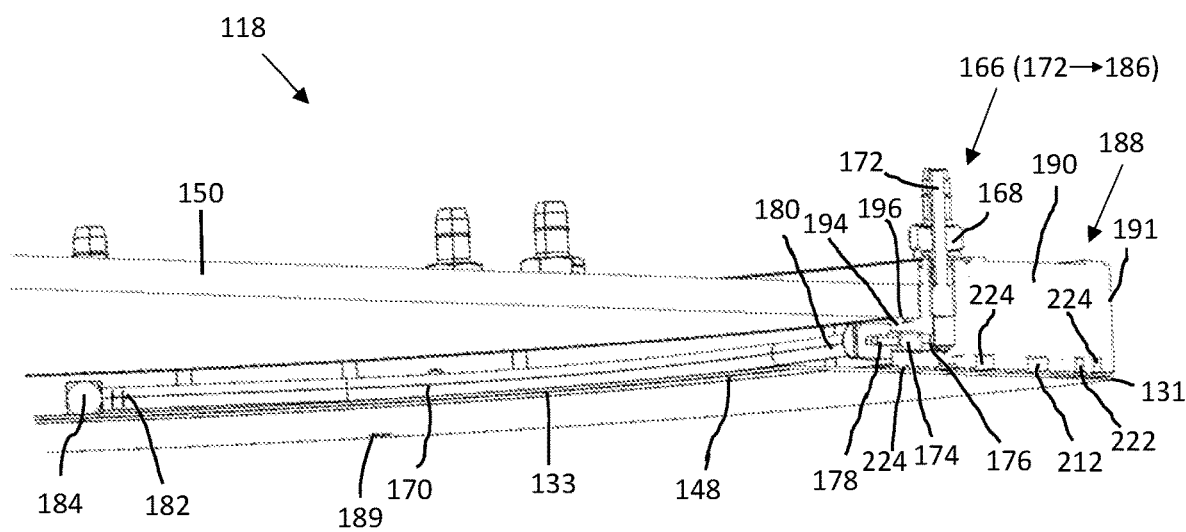
FIG. 3H shows a side perspective view of the enlarged portion 3G of FIG. 3F.
Figure 3I:
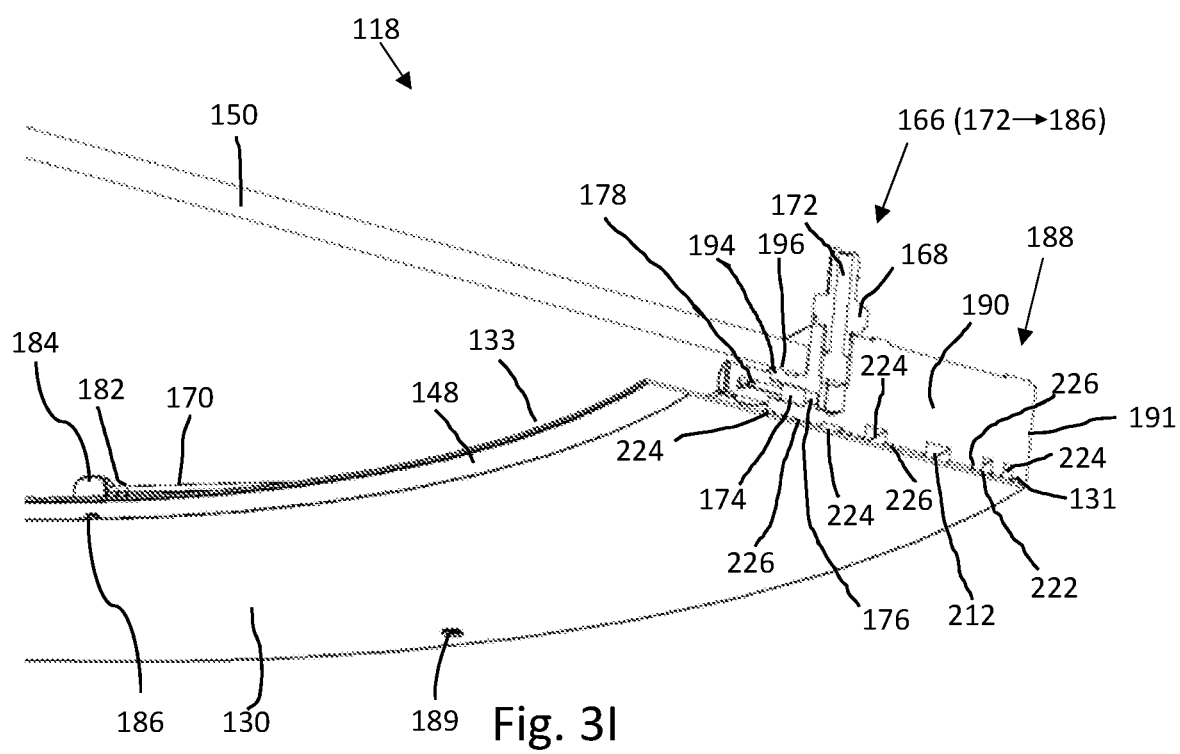
FIG. 3I shows an underside perspective view of the enlarged portion 3G of FIG. 3F.

The superstrate may is held by the flexible portion 134 by reducing pressure in the first cavity 148. One manner of reducing pressure in the first cavity 148 is providing a vacuum to the first cavity. In order to also provide a vacuum to the first cavity 148 of the member 130, the chuck assembly 118 may further include a path 166 (also referred herein as a vacuum path) in communication with the first cavity 148. In a case that there is already a pressure differential within the assembly relative to the atmosphere around the assembly, the path 166 can be used as a manner of reducing pressure in the first cavity without being coupled to a vacuum. The vacuum path 166 is best shown in FIGS. 3G, 3H, and 3I. As described in more detail below, the vacuum path 166 may start with a first passage 172 and end with a through hole 186. FIG. 3F shows a cross section taken along line 3F-3F of FIG. 3B. FIG. 3G shows an enlarged portion 3G of FIG. 3F. FIG. 3H shows a side perspective view of the enlarged portion 3G of FIG. 3F. FIG. 3I shows an underside perspective view of the enlarged portion 3G of FIG. 3F. The vacuum path 166 may include components that together allow the first cavity 148 to impart a vacuum onto the superstrate 108. In the illustrated example embodiment, the vacuum path 166 includes a second port 168 connectable with a vacuum source (not shown) and a routing tube 170 connecting the second port 168 to the first cavity 148. The second port 168 may be connected to the vacuum source via a tube (not shown), for example. The second port 168 includes a first passage 172 in communication with a second passage 174, where a first end 176 of the second passage 174 connects with the first passage 172 and a second end 178 of the second passage 174 connects to the routing tube 170. The routing tube 170 may be a flexible tube having a first end 180 connected to the second end of the 178 of the second passage 174 of the second port 168 and having a second end 182 connected to a fitting 184, e.g., a pneumatic fitting. The fitting 184 is also connected to a through hole 186 formed through the flexible portion 134 of the member 130 and leading into the first cavity 148. That is, by being connected to both the routing tube 170 and the through hole 186, the fitting 184 directs the vacuum suction downwardly into the first cavity 148 via the through hole 186. Thus, when the second port 168 is connected to the vacuum source, a vacuum can be applied to first cavity 148 in order to provide a suction force capable of coupling the area of the superstrate 108 under the first cavity 148 with the flexible portion 134.

One or more additional vacuum paths may be implemented that have the same structure as the above-discussed vacuum path 166, where each vacuum path is in communication with the same first cavity 148 and/or communication with a corresponding additional first cavity (not shown) formed in the member 130. The additional first cavity or cavities may be disposed concentrically around the first cavity 148. That is, the additional first cavity or cavities may also be concentrically disposed around the central opening 132, but may be located at a greater radial distance from the inner edge 133 than the illustrated first cavity 148. In an embodiment, the inner diameter of the member 130 may be smaller and/or the first cavity 148 may have additional lands. For example, as best seen in FIG. 3F, an additional vacuum path 167 having the same structure as the vacuum path 166 may be located at a position diametrically opposing the vacuum path 166. The additional first cavity or vacuum cavities may be used to assist in separating the superstrate from a cured layer as part of the planarization process discussed below in more detail. In another aspect, the additional cavity or vacuum cavities allow the same chuck assembly 118 to be used with different sized superstrates.

In another embodiment, it is possible that the first cavity 148 and vacuum path 166 may be replaced with another mechanism for coupling the member 130 with a superstrate. For example, in place of a cavity/vacuum arrangement, an electrode that applies an electrostatic force may be included. Another option is mechanical latching where a mechanical structure on the underside of the member 130 is matable with the superstrate.

The chuck assembly 118 may further include a support ring 188. The support ring 188 need not be made of a transparent material that allows for UV light to pass through. That is the support ring 188 may be composed of an opaque material with respect to UV light. The support ring 188 may be composed of plastic (e.g. acrylic), glass (e.g. fused silica, borosilicate), metal (e.g. aluminum, stainless steel), or ceramic (e.g. zirconia, sapphire, alumina). In an example embodiment, the support ring 188 may be composed of the same material as the member 130.

Figure 4:
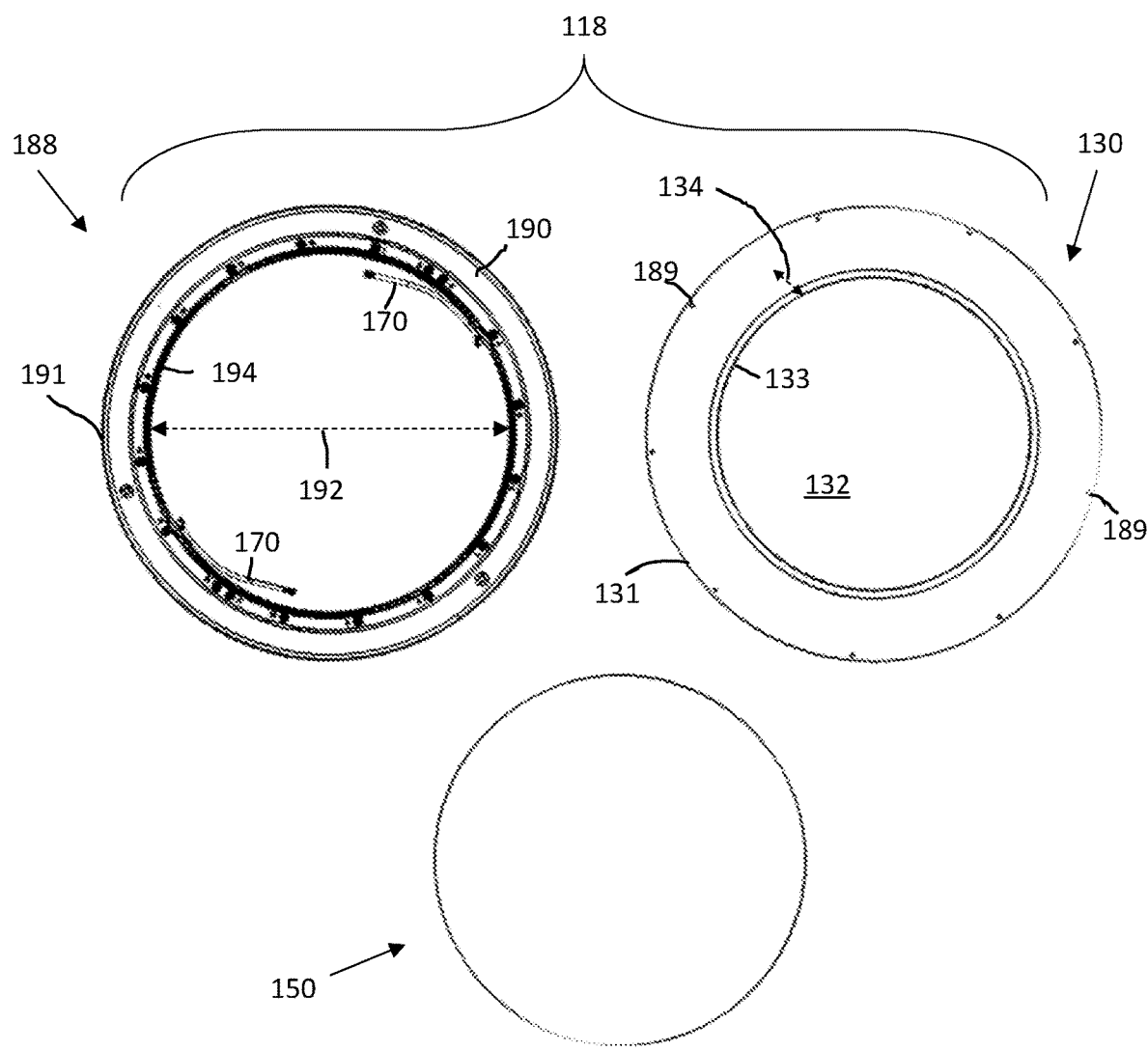
FIG. 4 shows an exploded view of the chuck assembly of FIGS. 3A to 3F.

FIG. 4 shows an exploded view where the support ring 188 is shown separated from the member 130 and the light transmitting member 150. As best seen in FIG. 4, the support ring 188 may generally include a circular main body 190 defining an open central area 192. The outer circumference of the support ring 188 may be uniform. The inner circumference of the support ring 188 may include a step 194 that provides a receiving surface 196 for receiving the light transmitting member 150. That is, as best seen in FIGS. 3D, 3E, 3G, 3H, 3I the light transmitting member 150 may be placed onto the receiving surface 196 of the step 194, thereby covering the central area 192. The light transmitting member 150 may be secured onto the receiving surface 196, such as with an adhesive. In this manner, when the light transmitting member 150 is placed/secured onto the receiving surface 196, the second cavity 152 is defined by the underside surface of the light transmitting member, the inner surface of support ring 188 (more particularly, the inner surface of the step 194), and the upper surface of the member 130.

The member 130 may be coupled to the underside surface of the support ring 188 using a coupling member (not shown) such as a screw, nut/bolt, adhesive and the like. The coupling member may preferably be located adjacent the outer edge 191 of the support ring 188 and adjacent the outer edge 131 of the member 130. When the coupling member is a screw, the coupling member preferably passes through the member 130 adjacent the outer edge 131 and into the support ring 188 adjacent the outer edge 191, such as through a plurality of receiving holes 189 (FIG. 3E, 3H, 3I, 4, 5C, 5F). When the coupling member is an adhesive, the coupling member is preferably located between the member 130 adjacent the outer edge 131 and the support ring 188 adjacent the outer edge 191. In this manner, an upper surface of the member 130 contacts and is fixed to the underside surface of the circular main body 190 of the support ring 188 adjacent the outer edge 131 and the outer edge 191. Additional surface area of member 130 may be selectively coupled to the support ring 188 as part of the planarization process. The manner of selectively coupling the additional surface area of the member 130 to the support ring 188 is discussed in more detail below.

As shown in FIGS. 3C, 3D, and 3E, all or a portion of the fluid path 154 and/or additional fluid path 155 discussed above may be contained within the support ring 188, and all or a portion as shown in FIGS. 3F, 3G, 3H, and 3I of the vacuum path 166 and/or additional vacuum path may be contained within the support ring 188. More particularly, a portion of the first port 156, a portion of the first passage 158, the second passage 160, the first end 162, and the second end 164 of the fluid path 154 may be contained within the support ring 188, while a portion of the second port 168, a portion of the first passage 172, the second passage 174, the first end 176, and the second end 178 of the vacuum path 166 may be contained within the support ring 188. However, as best shown in FIGS. 3G and 3H, the routing tube 170 may be external to the support ring 188. Thus, the support ring 188, in addition supporting the light transmitting member 150 and the member 130, may also provide the pathway/structure for the fluid paths and vacuum paths. In an alternative embodiment, there is no routing tube 170 and the vacuum passes through a port in the support ring 188 via a channel from the inflexible portion 135 of the member 130 to the flexible portion 134 of the member 130 to the first cavity 148.

Figure 5A:
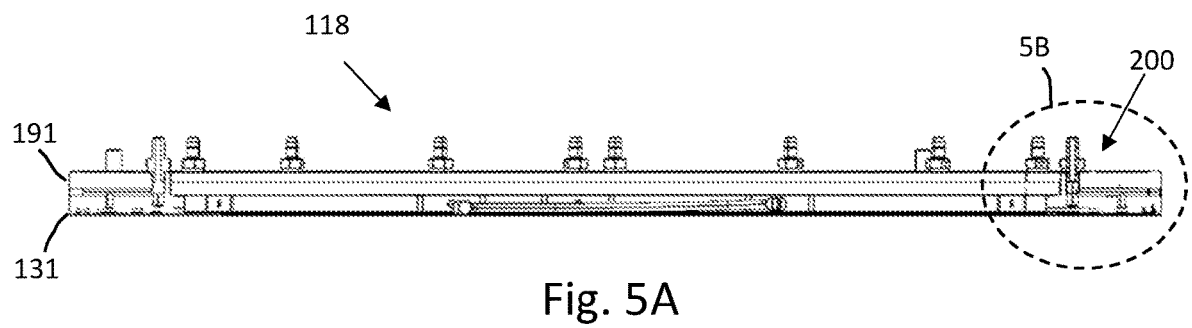
FIG. 5A shows a cross section taken along line 5A-5A of FIG. 3B.
Figure 5B:
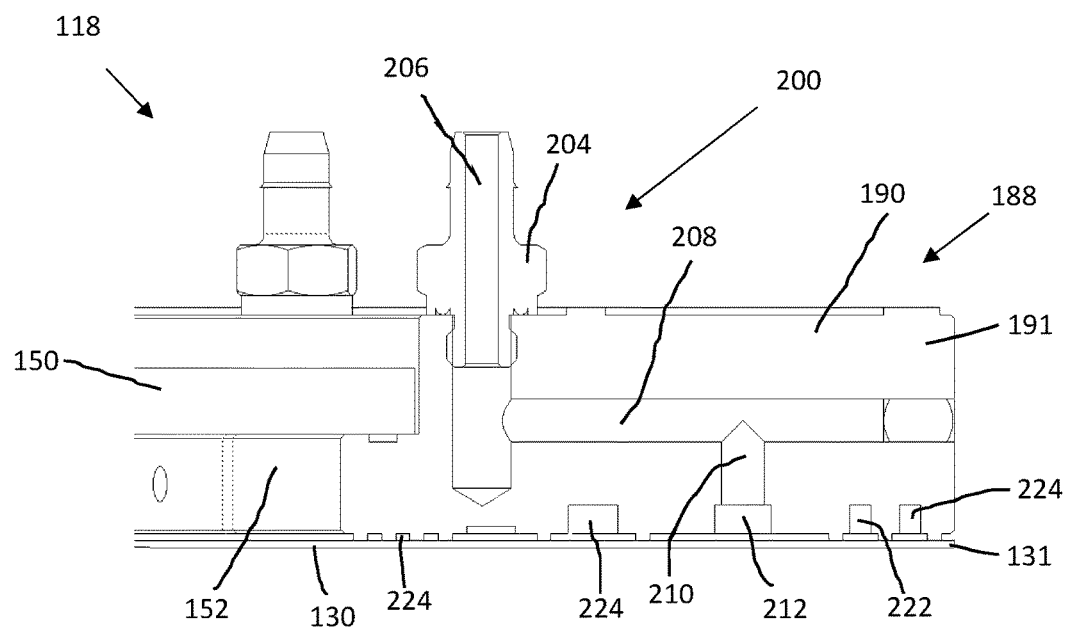
FIG. 5B shows an enlarged portion 5B of FIG. 5A.
Figure 5C:
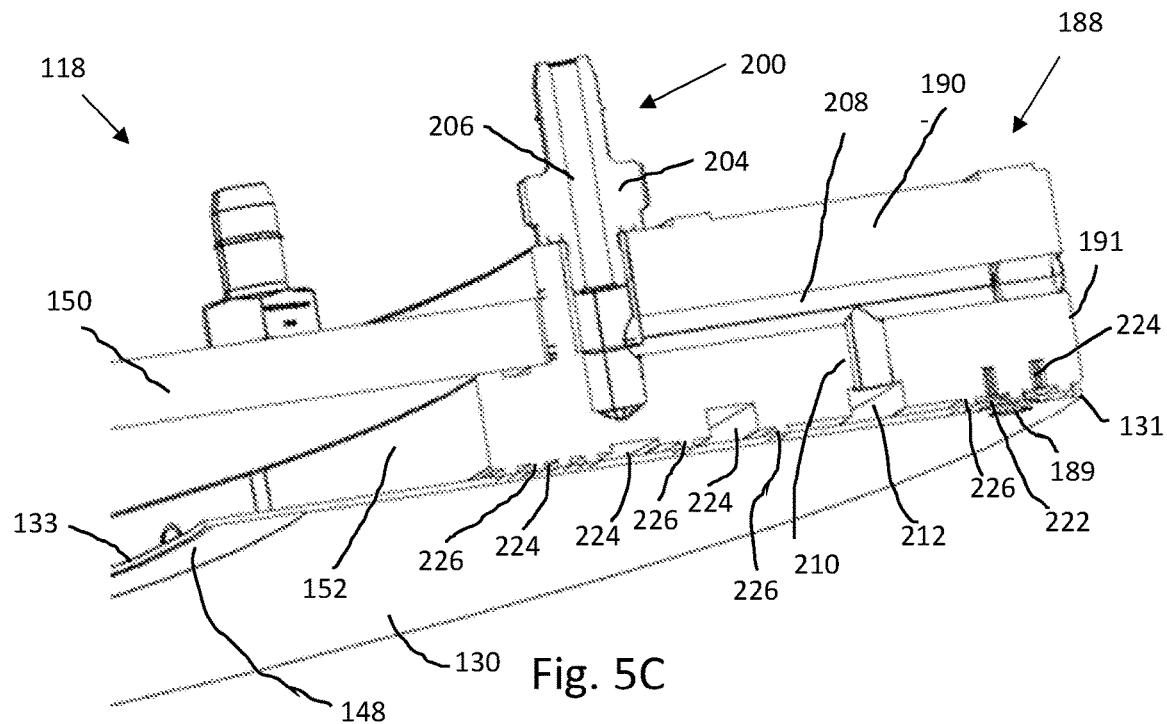
FIG. 5C shows a side perspective view of the enlarged portion 5B of FIG. 5A.
Figure 5D:
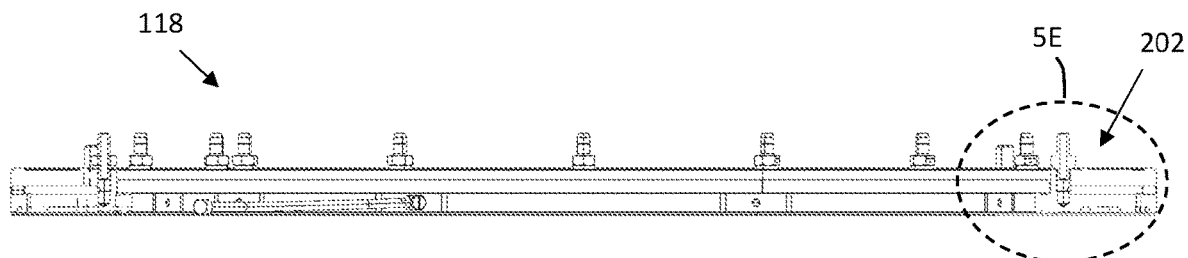
FIG. 5D shows a cross section taken along line 5D-5D of FIG. 3B.
Figure 5E:
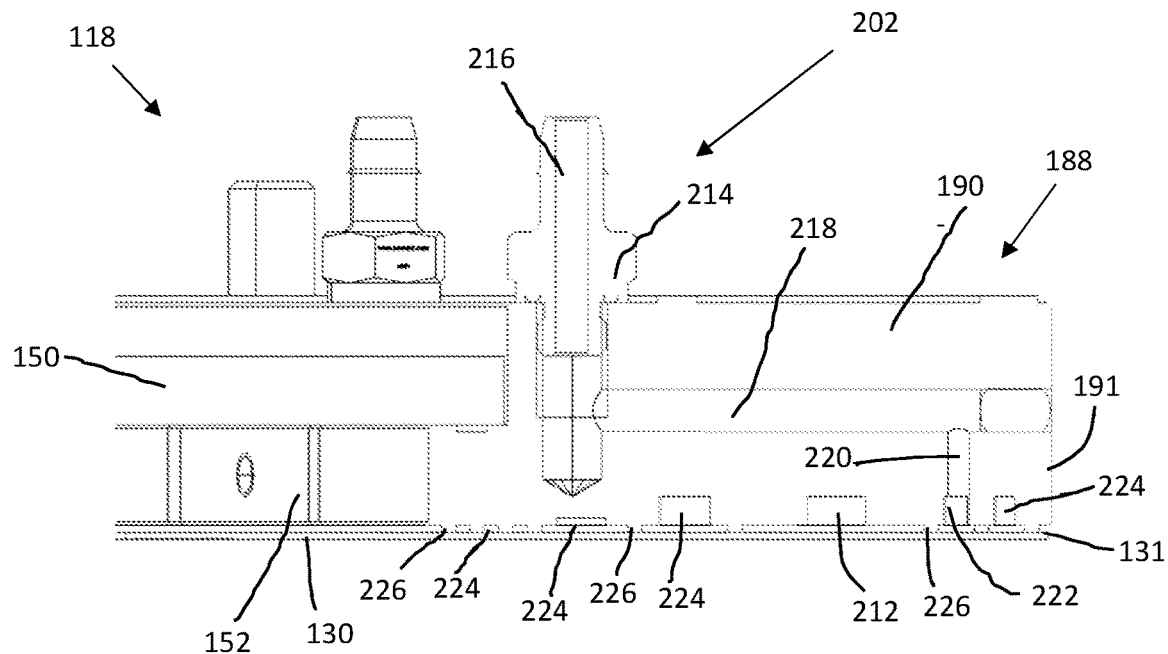
FIG. 5E shows an enlarged portion 5E of FIG. 5D.
Figure 5F:
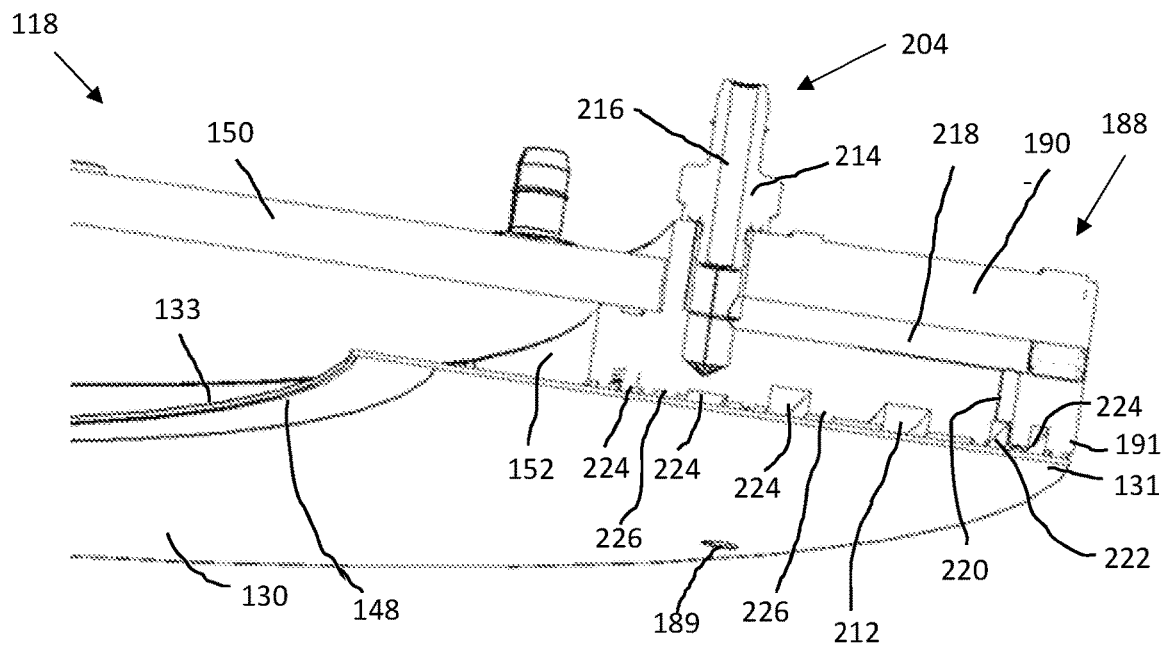
FIG. 5F shows a side perspective view of the enlarged portion 5E of FIG. 5D.

The chuck assembly 118 may further include additional vacuum paths that allow the member 130 to be selectively secured to the underside surface of the support ring 188. While the above-described vacuum flow paths communicate with the first cavity 148 of the member 130, the additional vacuum paths that allow the member 130 to be selectively secured to the underside surface of the support ring 188 are annular cavities in the support ring 188 that are open on the underside surface of the support ring 188. FIGS. 5A to 5C show an example of a first vacuum path 200 used for selectively securing the member 130 to the support ring 188. FIGS. 5D to 5F show an example of a second vacuum path 202 used for selectively securing the member 130 to the support ring 188.

FIG. 5A shows a cross section taken along line 5A-5A of FIG. 3B. FIG. 5B shows an enlarged portion 5B of FIG. 5A. FIG. 5C shows a side perspective view of the enlarged portion 5B of FIG. 5A. The first vacuum path 200 may include components that together impart a vacuum suction force onto the upper surface of the member 130 to further secure the member 130 to the underside surface of the support ring 188. In the illustrated example embodiment, the first vacuum path 200 includes a first port 204 connectable with a vacuum source (not shown). The first port 204 of the vacuum path 200 may be connected to the vacuum source via a tube (not shown), for example. As best seen in FIGS. 5B and 5C, the first port 204 of the vacuum path 200 includes a first passage 206 connected with a second passage 208, and the second passage 208 is connected with a third cavity 210. As also best seen in FIGS. 5B and 5C, the first passage 206 may be oriented vertically to direct the vacuum downwardly, the second passage 208 of the vacuum path 200 may be oriented horizontally to direct the vacuum radially, and the third cavity 210 of the vacuum path 200 may be oriented vertically to direct the vacuum downwardly. The third cavity 210 of the vacuum path 200 may be connected a first annular cavity 212 having an open end facing downwardly toward the member 130. Thus, when the first port 204 of the vacuum path 200 is connected to the vacuum source, and the upper side surface of the member 130 is in contact with the underside surface of the support ring 188, a vacuum can be applied to the first annular cavity 212 of the vacuum path 200 to secure the member 130 to the support ring 188, via the first vacuum path 200.

FIG. 5D shows a cross section taken along line 5D-5D of FIG. 3B. FIG. 5E shows an enlarged portion 5E of FIG. 5D. FIG. 5F shows a side perspective view of the enlarged portion 5E of FIG. 5D. The second vacuum path 202 may include components that together impart a vacuum suction force onto the upper surface of the member 130 to secure the member 130 to the underside surface of the support ring 188. In the illustrated example embodiment, the second vacuum path 202 includes a second port 214 connectable with a vacuum source (not shown). The second port 214 of second vacuum path 202 may be connected to the vacuum source via a tube (not shown), for example. As best seen in FIGS. 5E and 5F, the second port 214 of second vacuum path 202 includes a first passage 216 connected with a second passage 218, and the second passage 218 is connected with a third cavity 220. As also best seen in FIGS. 5E and 5F, the first passage 216 of second vacuum path 202 may be oriented vertically to direct the vacuum downwardly, the second passage 218 of second vacuum path 202 may be oriented horizontally to direct the vacuum radially, and the third cavity 220 of second vacuum path 202 may be oriented vertically to direct the vacuum downwardly. The third cavity 220 of second vacuum path 202 may be connected a second annular cavity 222 having an open end facing downwardly toward the member 130. Thus, when the second port 214 of second vacuum path 202 of the vacuum path 202 is connected to the vacuum source, and the upper side surface of the member 130 is in contact with the underside surface of the support ring 188, a vacuum can be applied to the first annular cavity 212 of second vacuum path 202 to secure the member 130 to the support ring 188, via the second vacuum path 202.

As best seen by comparing FIGS. 5B and 5C with FIGS. 5E and 5F, the first annular cavity 212 is located radially inwardly relative to the second annular cavity 222. That is, the first annular cavity 212 is closer to the second cavity 152 than the second annular cavity 222 in a radial direction. Because the first annular cavity 212 and the second annular cavity 222 are different radial locations, each cavity will apply a suction force to a different annular section of the upper side surface of the member 130. Furthermore, because each of the first annular cavity 212 and the second annular cavity 222 are in communication with a vacuum source via distinct flow paths (i.e., the first annular cavity 212 is part of the first flow path 200 and the second annular cavity 222 is part of the second flow path 202), the vacuum can be independently applied to each cavity. For example, if a vacuum is applied only to the second annular cavity 212, then the suction force will only be imparted on the portion of upper side surface of the member 130 that contacts the second annular cavity 212. However, if vacuum is applied to both the first annular cavity 212 and the second annular cavity 222 at the same time, then suction force will be imparted on the a wider area of the upper side surface of the member 130, i.e., the portion of the upper side surface of the member 130 that contacts the first annular cavity 212 and the portion of the upper side surface of the member 130 that contact the second annular cavity 222.

As shown in FIGS. 3C to 3I and 5A to 5F, the support ring 188 may include additional annular cavities 224 that may impart a vacuum suction onto the member 130 in the same manner as discussed above. That is, each of the additional annular cavities 224 may be in communication with a vacuum source via a port and connecting cavities. The additional annular cavities 224 may be spaced apart in a radial direction. The number of additional annular cavities 224 may be chosen to provide the optimal control over how much surface area of the member 130 is suctioned underneath the support ring 188. For example, the number of annular cavities may be from 1 to 10, from 3 to 7, or from 4 to 6. As seen in the figures, the annular cavities may be of varying size. The ratio of the cross sectional area of one of the annular cavities to the cross sectional area of another one of the annual cavities may be from 10:1 to 1:1, from 8:1 to 4:1, or from 5:1 to 3:1. Some of the annular cavities may have the same size and shape. The annular cavities may have a cross section shape that is rectangular or square. The support ring 188 may further include lands 226 between adjacent annular cavities. The lands 226 are the portion of the support ring that comes into contact with the upper surface of the member 130.

Figure 6:
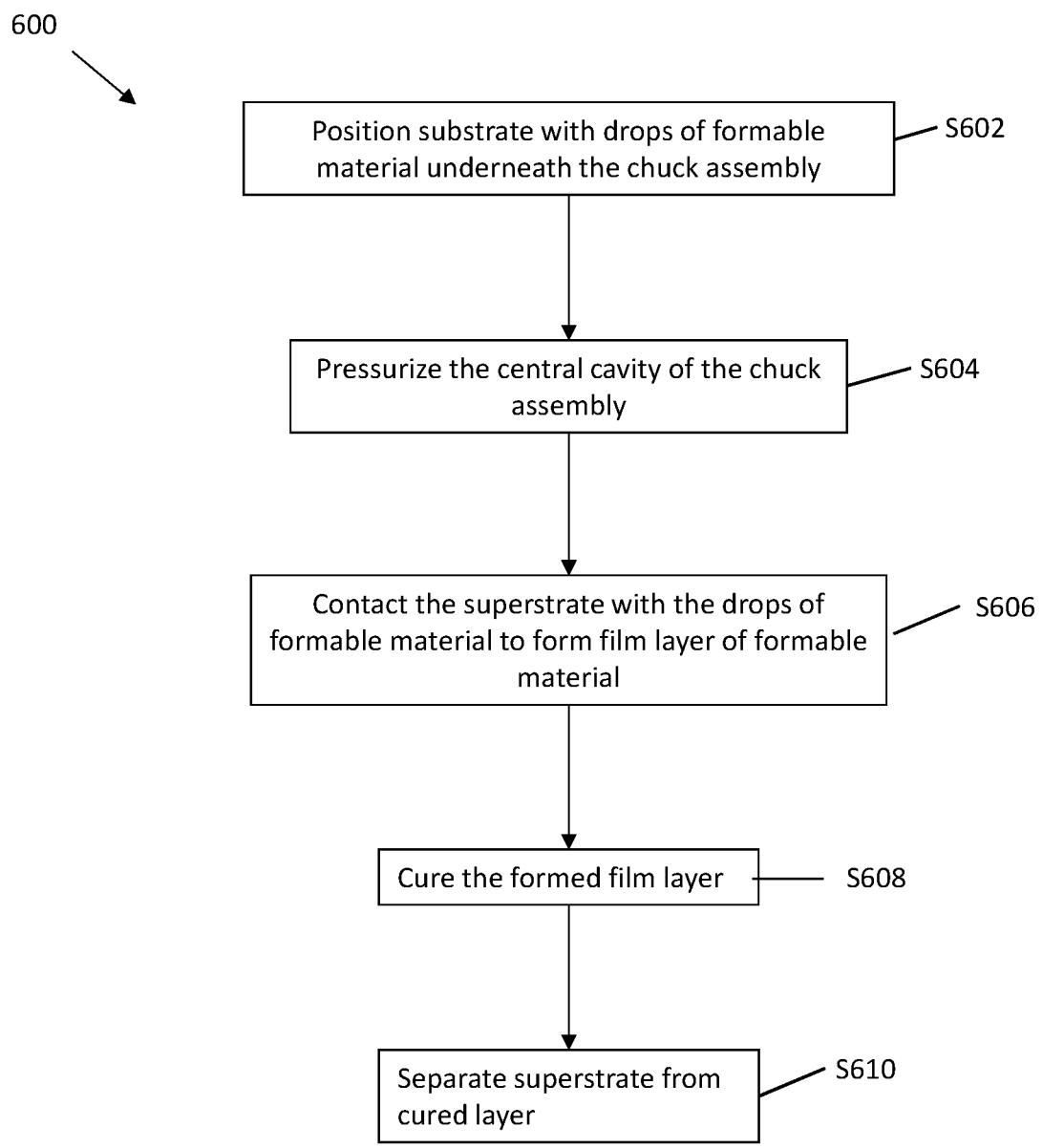
FIG. 6 shows a flow chart of an example planarization method in accordance with aspect of the present disclosure.

Operation of the chuck assembly 118 as part of the planarization process will now be described with reference to FIGS. 6 and 7A to 7L. FIG. 6 shows a flow chart of a planarization method 600. The method begins at step S602, where the substrate 102 having drops of formable material 124 dispensed thereon, is brought underneath the superstrate 108 that is coupled with the member 130 of the chuck assembly 118. Thus, prior to performing step S602, the drops of formable material are dispensed onto the substrate in the manner described above. This state of step S602 is shown in FIG. 7A, which is a schematic cross section of the chuck assembly 118.

Additionally, prior to forming step S602, the chuck assembly 118 is prepared by applying the vacuum suction to the first cavity 148 of the member 130 and contacting the first cavity 148 to the upper side surface of the superstrate 108, thereby coupling the superstrate 108 to the member 130. In a case where there are multiple vacuum cavities (e.g., 2) in the flexible portion 134 of the member 130, in one embodiment, less than all (e.g., only one) of the vacuum cavities will have a vacuum implemented during step S602. For example, in one embodiment, only the radially outermost first cavity relative to the central opening 132 may have a vacuum imparted. However, in another embodiment, all of the vacuum cavities (e.g., 2) may have a vacuum implemented during step S602.

Figure 7A:
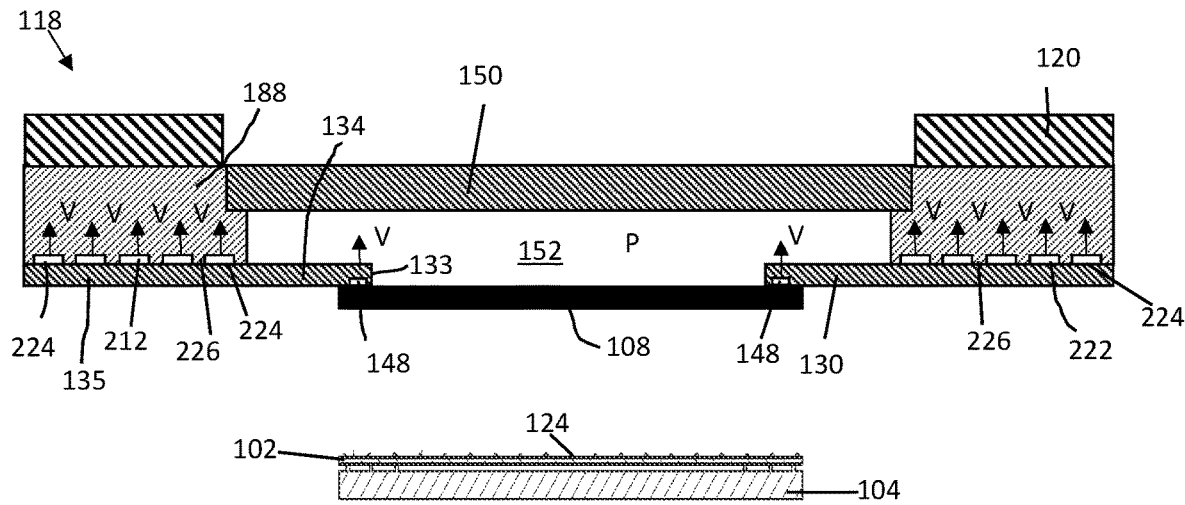
FIGS. 7A to 7L show a series of schematic cross sections of the planarization method of FIG. 6.

As shown in FIG. 7A, at the time that the substrate 102 is placed underneath the superstrate 108, the second cavity 152 may not yet be pressurized with positive pressure in one example embodiment. In another embodiment, to improve throughput, the second cavity 152 may be preemptively pressurized with positive pressure prior to the substrate 102 being positioned underneath the superstrate 108. Furthermore, during a calibration step prior to the moment shown in FIG. 7A, negative pressure may be applied in the second cavity 152 using the fluid path 154. At the moment shown in FIG. 7A, the pressure P in the second cavity is preferably equal to atmospheric pressure, but may also be positively pressurized or negatively pressurized. Furthermore, either prior to positioning the substrate 102 under the superstrate 108 or prior to step S604, the vacuum suction V may be applied to all of the annular cavities 212, 222, 224. With all of the annular cavities imparting a vacuum suction V to the upper side surface of the member 130, the member 130 is coupled with the support ring 188 across substantially the entire width of the support ring 188. Because the member 130 is coupled with the support ring 188 across the width of the support ring 188 via the vacuum suction V in the annular cavities 212, 222, 224, the member 130 is a divided into a flexible portion 134 and an inflexible portion 135. In other words, the flexible portion 134 of the member 130 is the portion that is not under the influence vacuum suction V, while the inflexible portion 135 of the member 130 is the portion that is under the influence of the vacuum suction V.

Figure 7B:
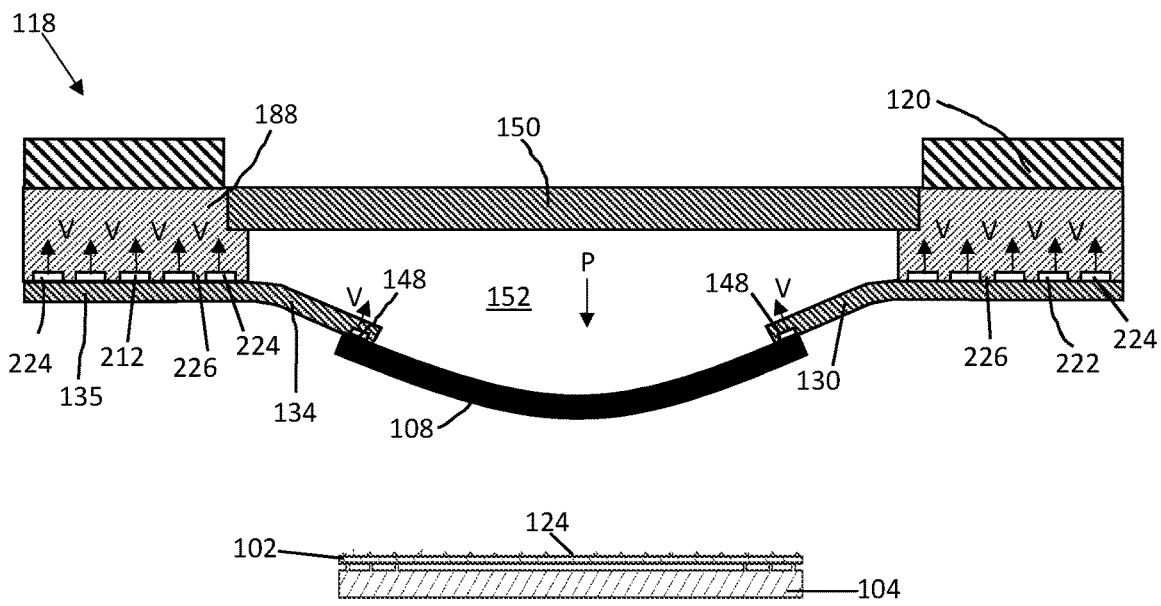

The method may proceed to step S604, where the second cavity 152 of the chuck assembly 118 is pressurized with positive pressure. FIG. 7B shows a schematic cross section of the chuck assembly 118 after the second cavity 152 has been pressurized. The second cavity 152 may be pressurized by imparting a positive pressure P via the fluid path 154. The amount of pressure P may be selected such that it is sufficient to bow the superstrate 108 with a desired curvature, as shown in FIG. 7B. The pressure P may be set to 0.1 to 10 kPa. At the same time, the vacuum suction is applied to all of the annular cavities 212, 222, 224 and the first cavity 148. Thus, during step S604, the member 130 remains attached to the superstrate 108 via the first cavity 148 and the member 130 remains attached to the support ring 188 across the width to maintain the inflexible portion 135 and the flexible portion 134. As also shown in FIG. 7B, because the positive pressure P, and the bowing of the superstrate 108, the flexible portion 134 of the member 130 will bend/bow as well. The second cavity 152 may be positively pressurized to pressure P prior to moving the chuck assembly 118 toward the substrate 102 or as the chuck assembly 118 moves toward the substrate 102. In the case that the pressurizing occurs while the chuck assembly 118 moves toward the substrate 102, the target pressure should be reached prior to the superstrate 108 coming into contact with the formable material 124.

Figure 7C:
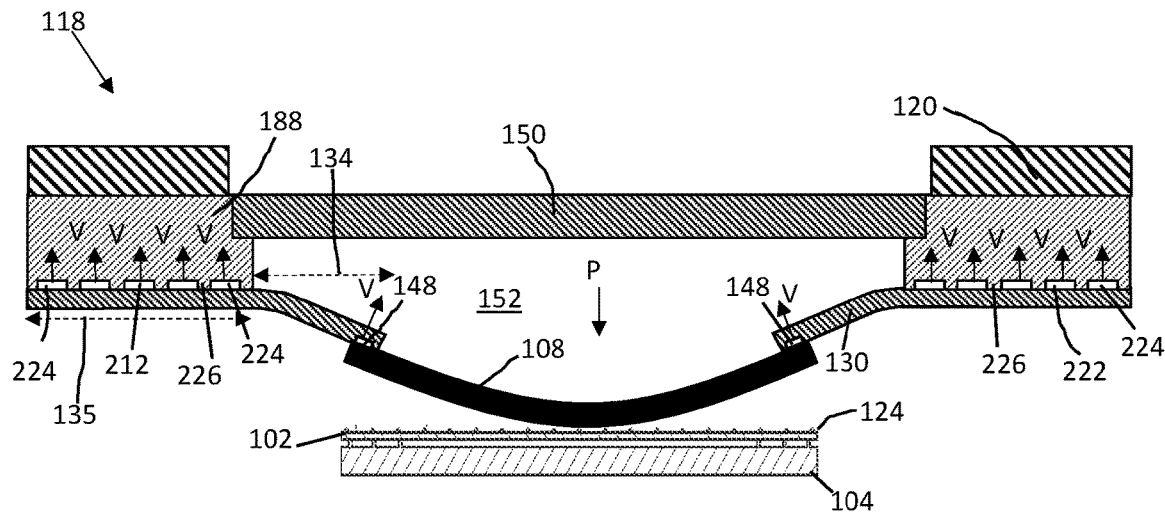

The method may proceed to step S606, where the superstrate 108 is brought into contact with the drops of formable material 124 on the substrate 102 to form a film layer 144. FIG. 7C shows a schematic cross section of the chuck assembly 118 just before the bowed superstrate 108 comes into contact with the drops of formable material 124. As shown in FIG. 7C, the positive pressure P is still maintained and the vacuum suction is still applied to all of the annular cavities 212, 222, 224 and the first cavity 148 up until this moment. In an embodiment, the pressure P in the second cavity 152 is increased as the superstrate 108 conforms with the formable material 124 to maintain a desired curvature. The applicant has determined that it often requires more pressure to maintain a certain superstrate curvature as the un-conformed region of the superstrate decreases. As a contact area of the superstrate increases during step S606 the contact area of the superstrate begins to conform to the shape of the superstrate under the contact area, while the portion of the superstrate outside the contact area is the un-conformed region in which the curvature needs to be controlled. Maintaining this curvature is important for minimizing gas trapping which can lead to non-fill defects. In an embodiment, the curvature just beyond the conformed portion (contact area) of the superstrate is controlled. In other words, the curvature of the superstrate in an annular region just outside the contact area is controlled. In an embodiment, a desired superstrate curvature profile in this annular region is controlled while formable material spreads underneath the contact area. This may require that the pressure P be maintained and/or increased during step S606. In an embodiment, the superstrate 108 is 'flat' (conforms to the shape of the substrate 102) after the formable material has stopped spreading.

Figure 7D:
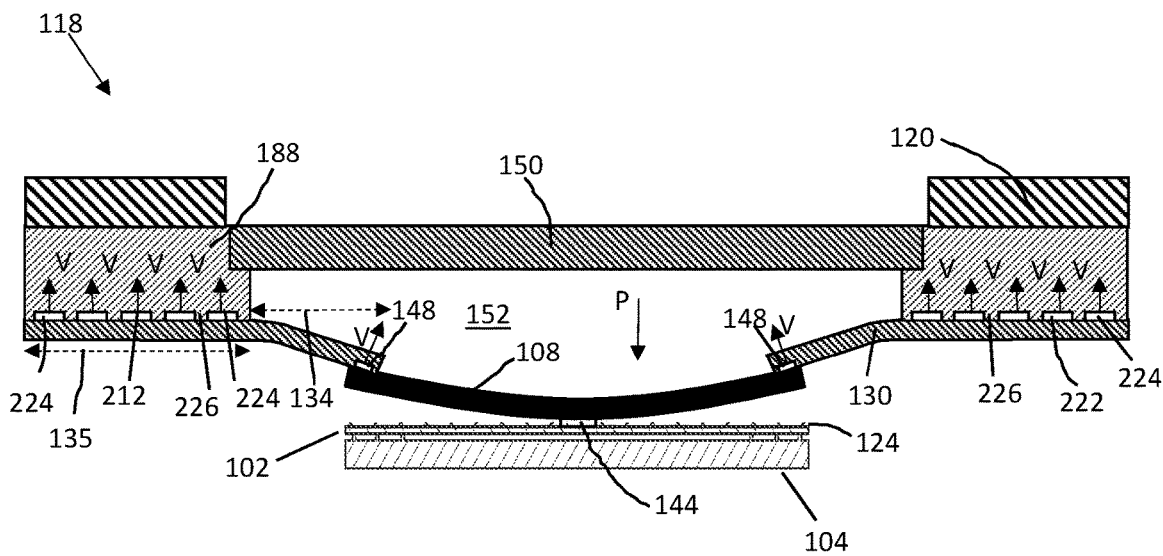

FIG. 7D shows a schematic cross section of the chuck assembly 118 as it continues to move downwardly toward the substrate 102 to form the film 144. As shown in FIG. 7D, as the chuck assembly 118 continues to move the superstrate 108 downwardly, a film 144 of the formable material 124 begins to form in an area between the center of the superstrate 108 and the substrate 102. Simultaneously with this action, the positive pressure P in the second cavity 152 may be maintained or increased so that as the superstrate 108 is pressed against the formable material 124, the superstrate 108 will maintain the desired curvature in the area of the superstrate that is about to conform with the formable material. Preferably, the pressure P is increased. That is, as seen in FIG. 7D as compared to FIG. 7C, the superstrate 108 has less of an arc in FIG. 7D such that the area of the superstrate that is about to conform with the formable material maintains the desired curvature. At the same time the flexible portion 134 of the member 130 also has a flatter shape in FIG. 7E as compared to FIG. 7D as it in turn begins to flatten along with the superstrate 108.

Figure 7E:
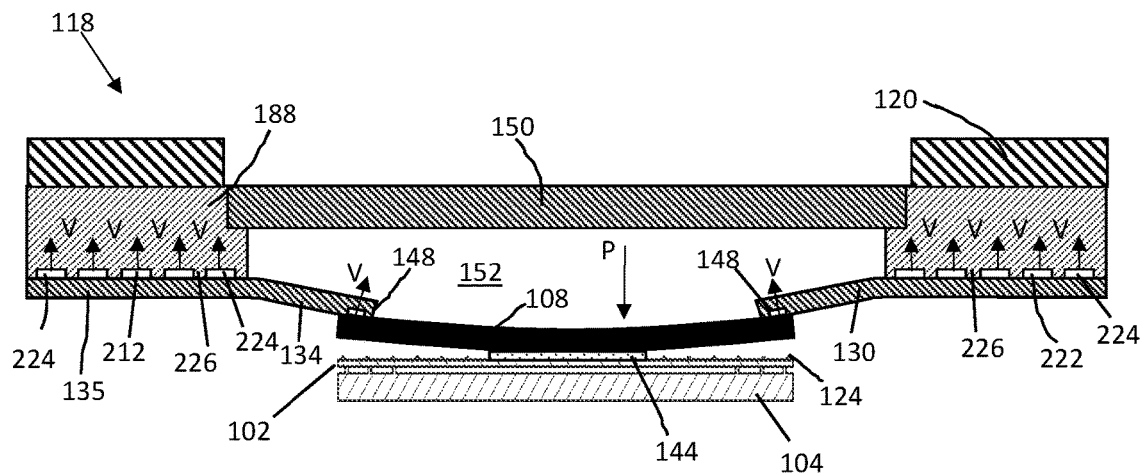

FIG. 7E shows a schematic cross section of the chuck assembly 118 at a point where the superstrate 108 is has been further pushed toward the substrate 102. As seen in FIG. 7E, as the superstrate 108 continues to press downwardly, the film 144 of formable material 124 spreads further along the surface of the substrate 102 toward the edges. The positive pressure P is further increased or maintained so as to maintain the desired curvature in the area of the substrate that is about to conform with the formable material. Preferably, the pressure P is further increased. Thus, as the superstrate 108 continues to press downwardly toward the substrate 102, the superstrate 108 continues to bend to maintain the desired curvature in the area of the substrate that is about to conform with the formable material. That is, the superstrate 108 in FIG. 7E has less of an arc than in FIG. 7D such that the area of the superstrate that is about to conform with the formable material maintains the desired curvature. At the same time, the flexible portion 134 also continues to flatten relative to FIGS. 7C and 7D. That is, the flexible portion 134 is flatter in FIG. 7E than in FIG. 7D. The vacuum suction is still applied to all of the annular cavities 212, 222, 224 and the first cavity 148 throughout the positions shown in FIGS. 7D and 7E.

Figure 7F:
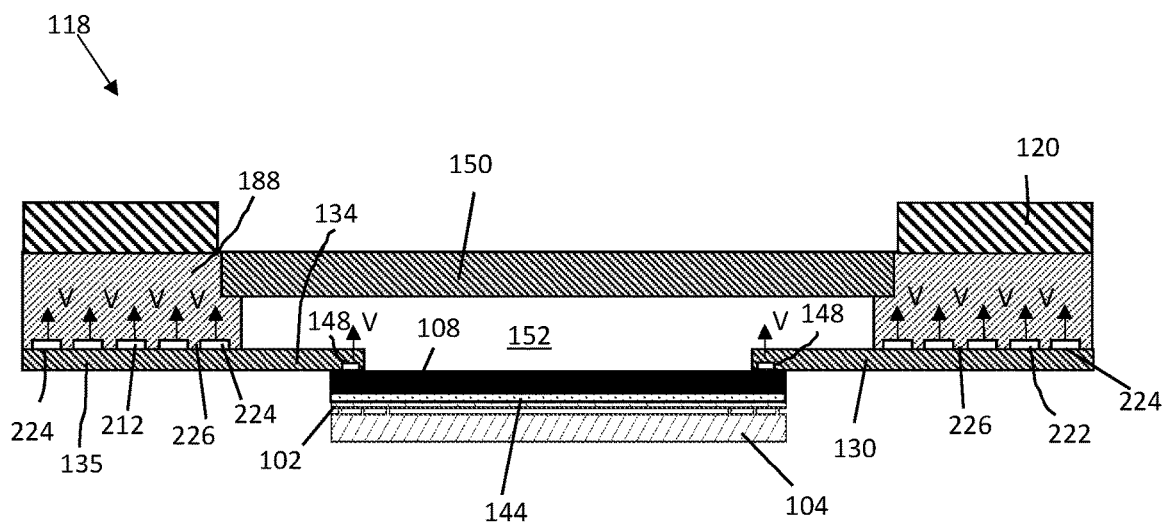

FIG. 7F shows a schematic cross section of the chuck assembly 118 at a point where the superstrate 108 has been fully pressed against the formable material 124 such that the film 144 is fully formed. As shown in FIG. 7F, the superstrate 108 has been pressed until it is once again flat. That is, the superstrate 108 no longer has an arc or lacks a substantial arc. Similar, the flexible portion 134 of the member 130 is flat or lacks a substantial bend. The positive pressure in the second cavity 152 at this point is completely removed or open to atmosphere. The vacuum suction is still applied to all of the annular cavities 212, 222, 224 and the first cavity 148, as the moment shown in FIG. 7E is prior to curing and prior to the release process described below.

As a result of the flexible portion 134 of the member 130 being coupled with the superstrate 108, the above-described difficulty in controlling the superstrate curvature and spread of polymerizable material near the edge of the superstrate is reduced or avoided as compared to a chuck assembly lacking the flexible portion. This is because the flexible portion 134 of the member 130 has less bending stiffness than the superstrate 108 and bends with the superstrate 108 during spreading of the formable material 124. By controlling the pressure in the second cavity 152, the curvature of superstrate 108 can be controlled throughout the spreading process from the center to the outer edge of the superstrate 108, which may lead to an improved planarization performance.

Figure 7G:
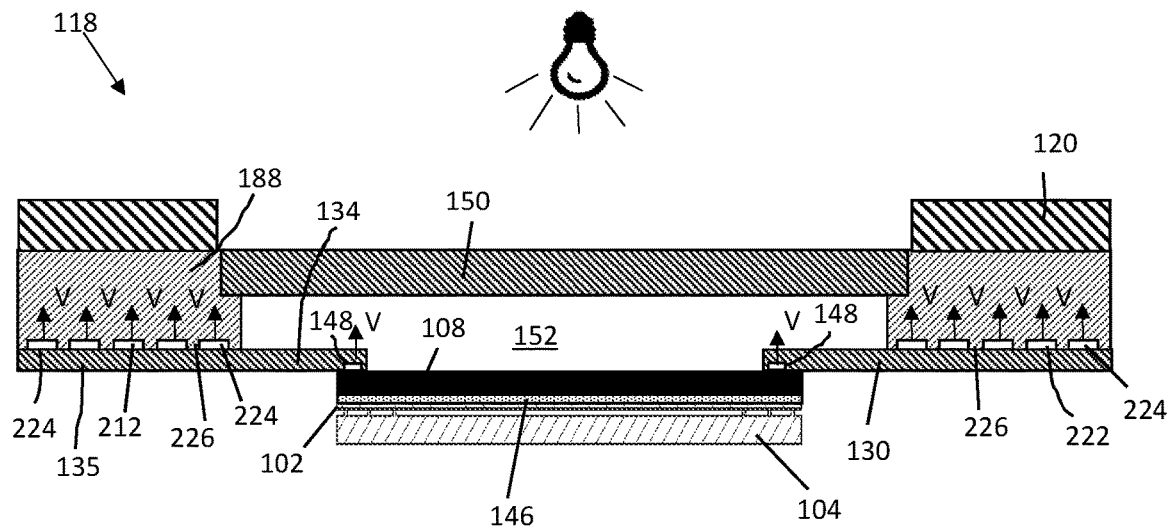

The method may then proceed to step S608, where the formed film 144 located between the superstrate 108 and the substrate 102 is cured. FIG. 7G shows a schematic cross section of the chuck assembly 118 during the curing step of step S608 in accordance with a first example embodiment. In the first example embodiment, the curing step may be performed in the manner noted above using the curing system. The radiation source 126 may emit, for example, UV radiation that is directed through the light-transmitting member and through the superstrate 108, each of which allow the UV radiation to pass through. In an embodiment the member 130 may be transparent to the UV radiation so that the member will not interfere with the curing process. In another embodiment the member 130 need not be transparent with respect to UV radiation. In a case that the member 130 is opaque with respect to UV radiation, the member 130 will need to be moved relative to a multilayer structure (substrate 102; uncured formable material 124; and superstrate 108) while the uncured formable material 124 in the multilayer combination is being cured during step S608. In this first example embodiment, where the UV radiation passes through the light-transmitting member, the light-transmitting member 150 may be composed of a material that transmits greater than 80% of light having a wavelength of 310-700 nm (i.e., UV light and visible light), e.g., sapphire, fused silica). After exposure to the UV radiation, the film 144 of formable material is cured, thereby forming a hardened cured layer 146. During the curing process the pressure P in the second cavity 152 may continue to be atmospheric and the vacuum suction may be still applied to all of the annular cavities 212, 222, 224 and the first cavity 148.

Figure 7H:
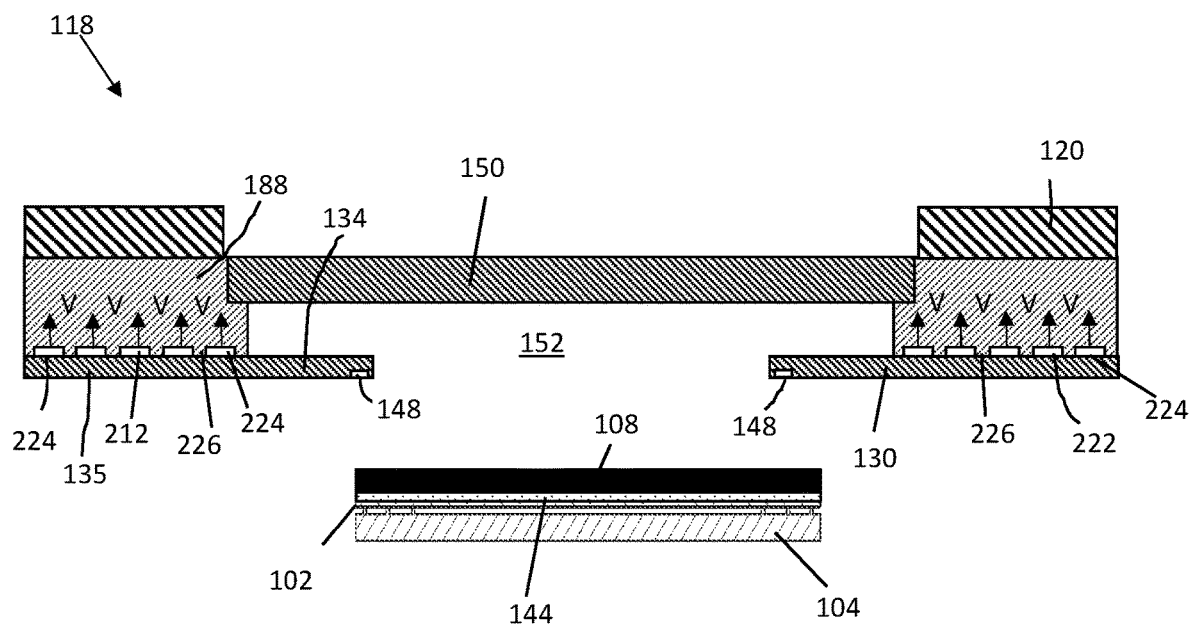
Figure 7I:
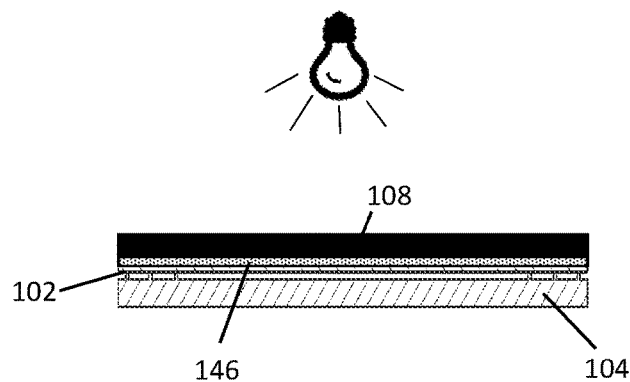

FIGS. 7H and 7I show a schematic cross section of the chuck assembly 118 during the curing step of step S608 in accordance with a second example embodiment. In the second example embodiment, as shown in FIG. 7H, the superstrate 108 is first released from the member 130. Thus, at this moment the vacuum applied to the first cavity 148 has been terminated. After the superstrate 108 has been released from the member 130, the combination of superstrate 108/film 144/substrate 102/substrate chuck 104 may be moved via the stage to another location. As shown in FIG. 7I, once the combination of superstrate 108/film 144/substrate 102/substrate chuck 104 is present at the other location, the curing process can be performed. As in the first embodiment, the curing may be performed by exposing the film 144 to UV light through the superstrate 108. However, because the combination of superstrate 108/film 144/substrate 102/substrate chuck 104 is at another location and no longer coupled to the chuck assembly 118, the UV light does not need to pass through the light-transmitting member 150 or through the member 130. In this second example embodiment, where the UV radiation does not pass through the light-transmitting member, the light-transmitting member 150 may be composed of a material that transmits greater than 80% of light having a wavelength of 400-700 nm (i.e., visible light and not UV light), e.g., glass, borosilicate, and does not need to be composed of a material that transmits UV light. After the curing is complete, the combination of superstrate 108/cured film 146/substrate 102/substrate chuck 104 may be brought back to the chuck assembly 118 and the superstrate 108 may be once again coupled with the member 130 by activating the first cavity 148.

Figure 7J:
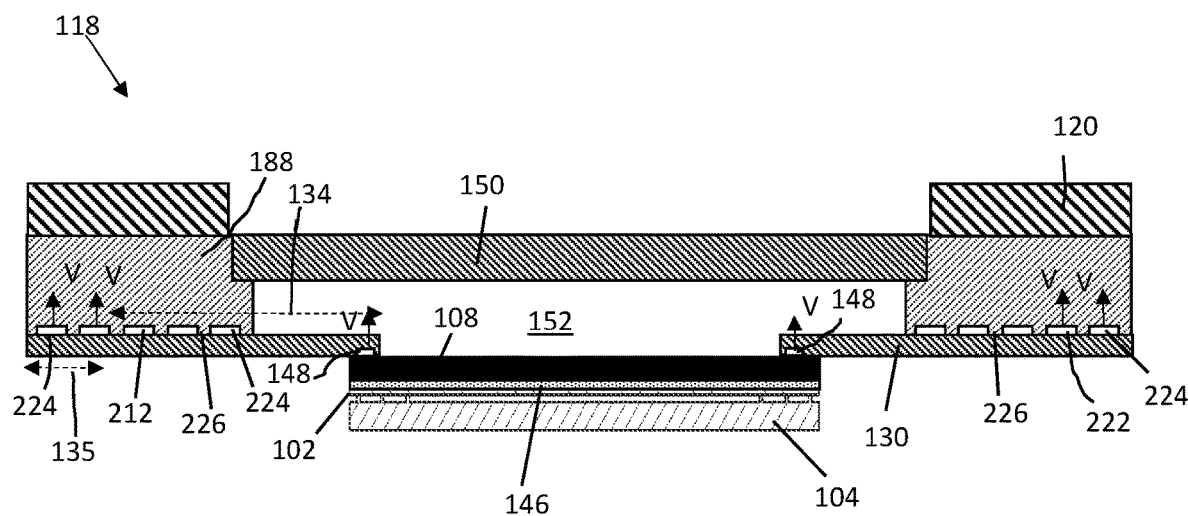

The method may then proceed to step S610, where the superstrate 108 is separated from the cured layer 146. In the case of the embodiment shown in FIG. 7G, the superstrate 108 has never been decoupled from the chuck assembly 118 and is therefore already positioned for separation. In the case of the embodiment shown in FIGS. 7H and 7I, after the curing is complete, as noted above, the superstrate 108 has once again been coupled with the chuck assembly 118 and is ready for separation. The separating of the superstrate 108 from the cured layer 146 may be performed by lifting the chuck assembly 118 upwardly away from the substrate 102. Just prior to beginning the lifting process the vacuum suction applied to one or more of the annular cavities 212, 222, 224 may be terminated. FIG. 7J shows a schematic cross section of the chuck assembly 118 just prior to lifting the chuck assembly 118 away from the substrate 102 in an example embodiment where three of the annular cavities (i.e., the innermost three) no longer have a vacuum applied. In this example embodiment, as shown in FIG. 7J, because the innermost consecutive three annular cavities no longer have a vacuum applied at the moment before lifting the chuck assembly 118, the inflexible portion 135 of the member 130 is only as large as the distance spanning the two consecutive outermost annular cavities still having the vacuum, while the flexible portion 134 is as large as the distance beginning at the third innermost annular cavity and ending at the inner edge of the member 130. That is, the flexible portion 134 of the member 130 has been increased and inflexible portion 135 has been decreased by removing the vacuum from certain annular cavities. This principle of removing the vacuum from one or more of the annular cavities 212, 222, 224, starting from the innermost annular cavity, allows the operator to customize how much of the member 130 should be made flexible during the separating step S610. As shown in FIG. 7J, the vacuum is maintained in the first cavity 148 of the member 130 so that the member 130 remains coupled to the superstrate 108. In a case where the member 130 has one or more additional vacuum cavities, some or all of the one or more additional vacuum cavities (e.g., 2) may be provided with a vacuum at this stage. For example, in a case that there are two vacuum cavities in the member 130, a vacuum may be implemented to only one of the vacuum cavities while the superstrate is pressing against the formable material, while a vacuum may be implemented for both vacuum cavities when the superstrate is lifted upwardly to separate from the cured film. At the same time, the pressure inside the second cavity 152 may be negatively pressurized via the fluid path 154. A negative pressure inside the second cavity 152 may assist in the separation process. However, in another embodiment, the second cavity 152 may be opened to atmosphere.

Figure 7K:
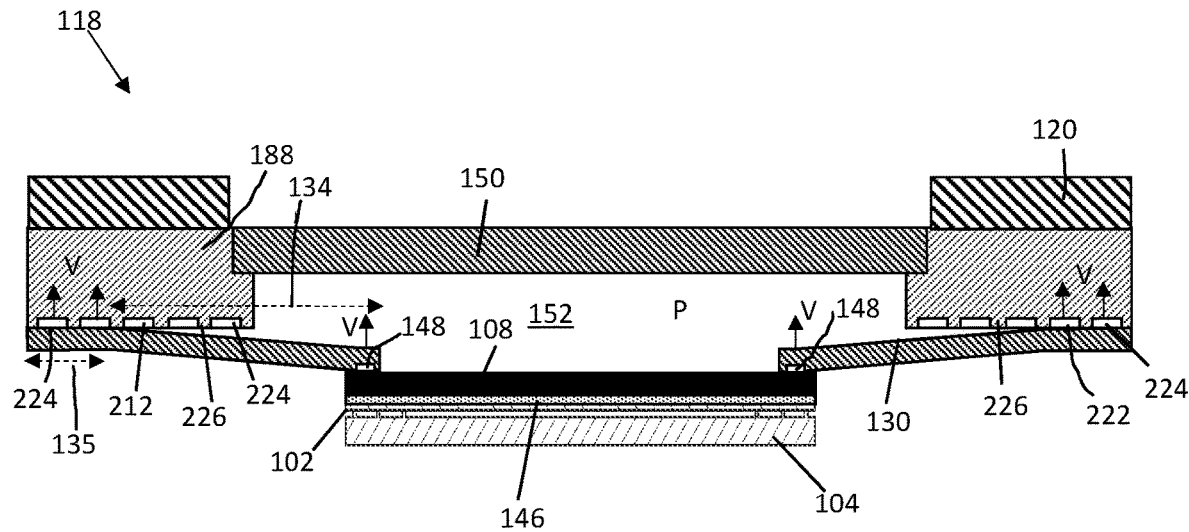

FIG. 7K shows a moment during the separation step S610 just prior to the superstrate 108 being released from the cured layer 146. As shown in FIG. 7K, because the chuck assembly 118 has been moved upwardly relative to the substrate 102, with the member 130 remains coupled with the superstrate 108 via the vacuum applied to the first cavity 148, the flexible portion 134 of the member 130 is bent. As noted above, because some of the annular cavities in the support ring 188 no longer have a vacuum applied, the flexible portion 134 of the member 130 is larger than during step S606 and step S608. Because the member 130 is able to bend during step S610 via the flexible portion 134, the ability to physically separate superstrate 108 from the cured layer 146 is improved. In particular, the flexible portion 134 of the member 130 may bend the outer edge of the superstrate 108 away from the substrate 102 to create a crack and separate the superstrate 108 from substrate 102. In alternative embodiment, a mechanical force, or air pressure may also be used in combination with the member 130 to create the crack and separate the superstrate 108 from substrate 102.

Figure 7L:
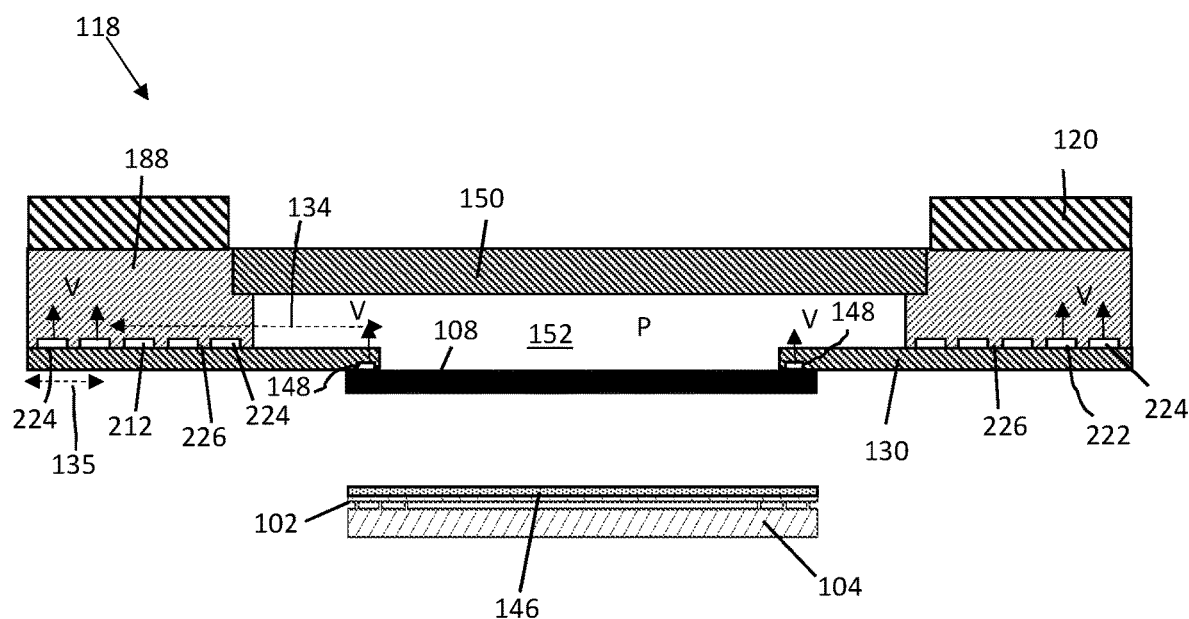

FIG. 7L shows a moment once the separation of step S610 has been competed just after superstrate 108 has been released from the cured layer 146. As shown in FIG. 7L after completing the separation, the chuck assembly 118 retains the superstrate 108 and the substrate 102 retains the cured layer 146. The planarization process 600 can be then be started again for another substrate by returning to the orientation shown in FIG. 7A. As noted above, the planarization process 600 may be repeated many times, on the order of tens of thousands. When it is desirable to remove the superstrate 108 from the chuck assembly 118 (for example after a predetermined number of planarization processes have been completed or if some other indicator suggests that the superstrate should be replaced), the vacuum applied to the first cavity 148 may be released.

While the example embodiment of the chuck assembly 118 includes the support ring 188 as a separate structural element from the member 130, in another example embodiment, the member may be a single structural piece including a portion shaped like the member and a portion shaped like the support ring. In other words, in such an embodiment, there is no separate support ring and instead there is a single continuous structure having a thick portion resembling the support ring and thin portion resembling the flexible portion of the support ring. Because there is not a separate support ring and member in such an embodiment, there is also no need for any of the annular cavities or a need for any of the ports and cavities that provide a vacuum path. Rather, only the fluid path(s) and possibly vacuum path(s) leading to the second cavity (i.e., an equivalent to fluid path 154) and possibly the vacuum path(s) leading to the flexible portion of the member (i.e., an equivalent to vacuum path 166) would be present in this embodiment. FIG. 8 shows a schematic cross section of such another example embodiment of a chuck assembly 518.

As shown in FIG. 8, in the additional example embodiment, the chuck assembly 518 may be similar to the chuck assembly 118, except that the instead of a member coupled with a support ring, the chuck assembly 518 includes a single member 530 having both the structure of the support ring of the first example chuck assembly 118 and some of the structure found in the support ring 188 of the first example chuck assembly 118. That is, the member 530 may similarly preferably have a ring shape and include a central opening 532, a flexible portion 534, and a first cavity 548 configured to hold the superstrate 108 to the flexible portion 534. The chuck assembly 518 may similarly further include a light-transmitting member 550 that covers the central opening 532, where the light-transmitting member 550 is the same as the light-transmitting member 150 of the first example embodiment. The chuck assembly 518 may similarly include a second cavity 552 and a fluid path (not shown) in communication with the second cavity 552 for pressurizing the second cavity 552. The fluid path 554 may be the same as the fluid path 154 of the first example embodiment. The chuck assembly 518 may further include a vacuum path (not shown) in communication with the first cavity 548 that is the same as in the first example embodiment.

Instead of a separate support ring, the member 530 may further include a support portion 588. The support portion 588 may have essentially the same structure as support ring 188 of the first example embodiment, except that there are no annular cavities because the support portion is part of the member 530 rather than a separate coupled piece. As with the first embodiment, the support portion 588 may include a circular main body defining an open central area, where the inner circumference of the support portion 588 includes a step 594 that provides a receiving surface for receiving the light transmitting member 550.

Similar to the first example embodiment, the member 530 may include an inflexible portion 535 and a flexible portion 534. However, in the chuck assembly 518, the length of the inflexible portion 535 is fixed because it is defined by the support portion 588, the support portion 588 being an integrated part of the member 530. For the same reason, the flexible portion 534 is fixed. That is, the thicker support portion 588 of the member 530 is inflexible, while the thinner flexible portion 534 is flexible. Thus, the chuck assembly 518 is similar to the check assembly 118 of the first example embodiment, except for the ability to change the length of the flexible and inflexible portions of the member as part of the planarization method. Furthermore, because the member 530 includes the support portion 588, in the chuck assembly 518, the second cavity 552 is defined specifically by the flexible portion 534. The material of the member 530 may be the same material as the member 130 or the support ring 188 described above, including the same modulus of elasticity. The thickness of the flexible portion 534 of the member 530 may be the same as the thickness of the member 130 detailed above with respect to the previous embodiment. The length of the flexible portion 534 of the member 530 may be the same as the length of the flexible portion 134 at the point in time when the flexible portion 134 is shortest, as detailed above with respect to the previous embodiment. The ratio of the length of the flexible portion 534 of the member 530 may be the same as the length to thickness ratio of the member 130 detailed above with respect to the previous embodiment. The chuck assembly 518 may be used for the same planarization method 600 discussed above, except that as noted above, there is no ability to change the length of the flexible and inflexible portions. Thus, the only difference when performing the method 600 would be in step S610 when separating the superstrate from the cured layer. In step S610, because there are no annular cavities in the chuck assembly 518, when lifting the chuck assembly 518 upwardly away from the cured layer, the flexible portion 534 remains the same size/length as prior to the separating and there is no selective applying of a vacuum to change the size/length of the flexible portion 534. While the chuck assembly 518 lacks this ability, in certain planarization processes, the benefit provided by changing the size/length of flexible portion during separation is not necessary. For example, under certain operating parameters it is possible to sufficiently perform the entire planarization process with a fixed-length flexible portion. Accordingly, in these instances, the simpler chuck assembly 518 may be used. In cases where the ability to change the length of the flexible portion is desirable, the chuck assembly 118 of the first example embodiment may be used. In an embodiment, the single member 530 is an integral component that has been machined or formed with vacuum channels and fluid channels. In an alternative embodiment, the single member 530 is made up of a plurality of components that are secured, fastened, and/or adhered together so as to more easily form the vacuum channels and the fluid channels.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A chuck assembly for holding a plate, comprising:
a plate holding member configured to hold the plate, the plate holding member including a flexible portion with a central opening; and
a cover member facing the central opening of the plate holding member,
wherein the flexible portion is configured to be bent by a pressure applied to the flexible portion, and
wherein a ratio of a thickness of the flexible portion to a length of the flexible portion is 1:2 to 1:1000.

2. The chuck assembly of claim 1, further comprising:
a fluid path connected to a cavity that is formed when the plate is held to the flexible portion;
wherein the cavity is further defined by the cover member and the flexible portion; and
wherein the pressure applied to the flexible portion is supplied via the cavity and causes the plate to be bowed and the flexible portion of the plate holding member to be bent.

3. The chuck assembly of claim 2, wherein the plate holding member includes an inflexible portion that is not bent when the pressure is supplied via the cavity.

4. The chuck assembly of claim 2, further comprising:
a support ring coupled with the plate holding member; and
wherein the cavity is further defined by a support ring.

5. The chuck assembly of claim 4, wherein the support ring comprises one or more annular cavities.

6. The chuck assembly of claim 5, wherein the one or more annular cavities face the plate holding member.

7. The chuck assembly of claim 5,
wherein the one or more annular cavities comprise a plurality of annular cavities, and
wherein the plurality of annular cavities are concentrically disposed within the support ring.

8. The chuck assembly of claim 5, wherein the one or more annular cavities are in communication with a vacuum source.

9. The chuck assembly of claim 8, wherein the one or more annular cavities are configured such that imparting a vacuum suction to the one or more annular cavities via the vacuum source couples the plate holding member to the support ring.

10. The chuck assembly of claim 8,
wherein the plate holding member includes an inflexible portion, and
wherein the one or more annular cavities are configured such that imparting a vacuum suction to the one or more annular cavities via the vacuum source increases a size of the inflexible portion while decreasing a size of the flexible portion.

11. The chuck assembly of claim 1, wherein the cover member is a light transmitting member.

12. The chuck assembly of claim 1, wherein the flexible portion includes a mechanism for coupling the plate holding member to the plate, wherein the mechanism includes at least one of:
a cavity/vacuum arrangement for coupling the plate to the plate holding member;
an electrode for coupling the plate to the plate holding member; or
a mechanical structure on an underside of the plate holding member that is matable with the plate.

13. The chuck assembly of claim 1, wherein the plate holding member has a flexural rigidity of 0.01 to 5 Pa·m$^3$.

14. The chuck assembly of claim 2, wherein the plate holding member includes an inflexible support portion;
wherein the cavity is further defined by the inflexible support portion of the member.

15. The chuck assembly of claim 14, wherein the inflexible support portion comprises a step supporting the cover member.

16. A planarization system, comprising:
the chuck assembly of claim 1;
a substrate chuck configured to hold a substrate;
a positioning system configured to contact formable material on the substrate with the plate; and
a curing system configured to cure the formable material under the plate so as to form cured formable material on the substrate.

17. A chuck assembly for holding a plate, comprising:
a plate holding member configured to hold the plate, the plate holding member including a flexible portion with a central opening; and
a cover member facing the central opening of the plate holding member,
wherein the flexible portion is configured to be bent by a pressure applied to the flexible portion, and
wherein the plate holding member has a flexural rigidity of 0.01 to 5 Pa·m$^3$.

18. The chuck assembly of claim 17, wherein the cover member is a light transmitting member.

19. A method of manufacturing an article, comprising:
dispensing a formable material onto a substrate;
retaining a plate with a chuck assembly, the chuck assembly comprising:
- a plate holding member configured to hold the plate, the plate holding member including a flexible portion with a central opening; and
- a cover member facing the central opening of the plate holding member; and
- wherein a cavity is formed by the plate being held by the plate holding member;
- wherein the cavity is further defined by the cover member and the flexible portion;
- wherein the flexible portion is configured to be bent by a pressure applied to the flexible portion via the cavity;
- wherein a ratio of a thickness of the flexible portion to a length of the flexible portion is 1:2 to 1:1000;

contacting formable material dispensed on the substrate with the plate;
curing the formable material with a curing source;
separating the plate from the cured formable material; and
processing the cured formable material to make the article.

20. A method of manufacturing an article, comprising:
dispensing a formable material onto a substrate;
retaining a plate with a chuck assembly, the chuck assembly comprising:
- a plate holding member configured to hold the plate, the plate holding member including a flexible portion with a central opening; and
- a cover member facing the central opening of the plate holding member; and
- wherein a cavity is formed by the plate being held by the plate holding member;
- wherein the cavity is further defined by the cover member and the flexible portion;
- wherein the flexible portion is configured to be bent by a pressure applied to the flexible portion via the cavity;
- wherein the plate holding member has a flexural rigidity of 0.01 to 5 Pa·$m^3$;

contacting formable material dispensed on the substrate with the plate;
curing the formable material with a curing source;
separating the plate from the cured formable material; and
processing the cured formable material to make the article.

* * * * *